United States Patent

(12) United States Patent
Suenaga et al.

(10) Patent No.: US 11,533,012 B2
(45) Date of Patent: Dec. 20, 2022

(54) HIGH-DENSITY INTEGRATED POWER CONTROL ASSEMBLIES HAVING SHARED COOLING SYSTEM WITH A MOTOR

(71) Applicant: Toyota Motor Engineering & Manufacturing North America, Inc., Plano, TX (US)

(72) Inventors: Shohei Suenaga, Ann Arbor, MI (US); Shailesh N. Joshi, Ann Arbor, MI (US); Danny J. Lohan, Ann Arbor, MI (US); Yanghe Liu, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 391 days.

(21) Appl. No.: 16/906,523

(22) Filed: Jun. 19, 2020

(65) Prior Publication Data

US 2021/0104970 A1 Apr. 8, 2021

Related U.S. Application Data

(60) Provisional application No. 62/911,719, filed on Oct. 7, 2019.

(51) Int. Cl.
*H02P 27/08* (2006.01)
*H02K 11/33* (2016.01)
(Continued)

(52) U.S. Cl.
CPC .............. *H02P 27/08* (2013.01); *H02K 11/33* (2016.01); *H05K 1/0203* (2013.01); *H05K 1/181* (2013.01);
(Continued)

(58) Field of Classification Search
CPC ...... H02P 27/08; H02K 11/33; H05K 1/0203; H05K 1/181; H05K 2201/10015;
(Continued)

(56) References Cited

U.S. PATENT DOCUMENTS 6,002,183 A * 12/1999 Iversen ................. H01L 25/162
257/691
8,274,807 B2 * 9/2012 Nishimori ............. H02M 7/003
363/147
(Continued)

FOREIGN PATENT DOCUMENTS

CN 103703671 B 2/2018
CN 106206330 B 2/2019
(Continued)

OTHER PUBLICATIONS

Li et al., "Reduction of Stray Inductance in Power Electronic Modules Using Basic Switching Cells" (https://www.researchgatenet/3publication/224188239_Reduction_of_stray_inductance_in_power_electronic_modules_using_basic_switching_cells), Published: Oct. 2010.
(Continued)

*Primary Examiner* — Michael P McFadden
(74) *Attorney, Agent, or Firm* — Dinsmore & Shohl LLP

(57) ABSTRACT

An integrated power control assembly mounted on an axial end of a three-phase motor includes a substrate, two input busbars each of positive and negative polarities alternatively spaced apart on the substrate, a plurality of sets of paired devices, and three output busbars corresponding to the three phases of the motor, wherein a set of paired devices includes a switching semiconductor and a diode. An inner input busbar has edges adjacent to an inner input busbar of opposite polarity and an outer input busbar of opposite polarity and configured to have at least twice as many devices as the outer input busbars. One or more sets of
(Continued)

paired devices are disposed axially on outer input busbars and on inner input busbars along the edges. An individual output busbar is disposed over and electrically coupled to one or more sets of paired devices disposed on adjacent input busbars of opposite polarity.

20 Claims, 13 Drawing Sheets

(51) Int. Cl.
  *H05K 1/18* (2006.01)
  *H05K 1/02* (2006.01)
(52) U.S. Cl.
  CPC ............... *H05K 2201/1009* (2013.01); *H05K 2201/10015* (2013.01); *H05K 2201/10166* (2013.01); *H05K 2201/10272* (2013.01)
(58) Field of Classification Search
  CPC . H05K 2201/1009; H05K 2201/10166; H05K 2201/10272
  See application file for complete search history.

(56) References Cited

U.S. PATENT DOCUMENTS

| | | |
|---|---|---|
| 9,484,830 B2 | 11/2016 | Zhang et al. |
| 9,530,795 B2 | 12/2016 | Quandt et al. |
| 9,692,277 B2 | 6/2017 | Pearce, Jr. et al. |
| 10,361,603 B2 | 7/2019 | Aizawa et al. |
| 10,396,631 B2 | 8/2019 | Herb |
| 2009/0086427 A1* | 4/2009 | Okumura ............ H02M 7/003 361/720 |
| 2009/0091892 A1* | 4/2009 | Otsuka ................ H05K 7/1432 361/715 |
| 2009/0161301 A1* | 6/2009 | Woody ................ H05K 7/209 361/678 |
| 2010/0302733 A1* | 12/2010 | Woody ................ H01L 23/473 361/689 |
| 2012/0106220 A1* | 5/2012 | Yamaguchi ......... H05K 7/209 363/131 |
| 2021/0083277 A1* | 3/2021 | Yamashita ........... H01M 4/485 |

FOREIGN PATENT DOCUMENTS

| | | |
|---|---|---|
| JP | 2006197781 A | 7/2006 |
| KR | 101679761 B1 | 11/2016 |
| KR | 20180136355 A | 12/2018 |
| WO | 2016096572 A3 | 8/2016 |

OTHER PUBLICATIONS

Ottosson, et al., "Electro-thermal Simulations of a Power Electronic Inverter for a Hybrid Car" (https://ieeexplore.ieee.org/document/5994604), IEEE International Electric Machines & Drives Conference, Published: 2011.

"Siemens Integrates EV Motor and Inverter in Single Housing; Common Cooling and SKiN" (https://www.greencarcongress.com/2014/10/20141017-siemens.html), Published: Oct. 17, 2014.

Peng, "Power Electronics' Circuit Topology—The Basic Switching Cells" (http://web.eecs.utk.edu/~tolbert/publications/pesc_2005_basic_cells.pdf), Michigan State University, Published: Nov. 12, 2019.

* cited by examiner

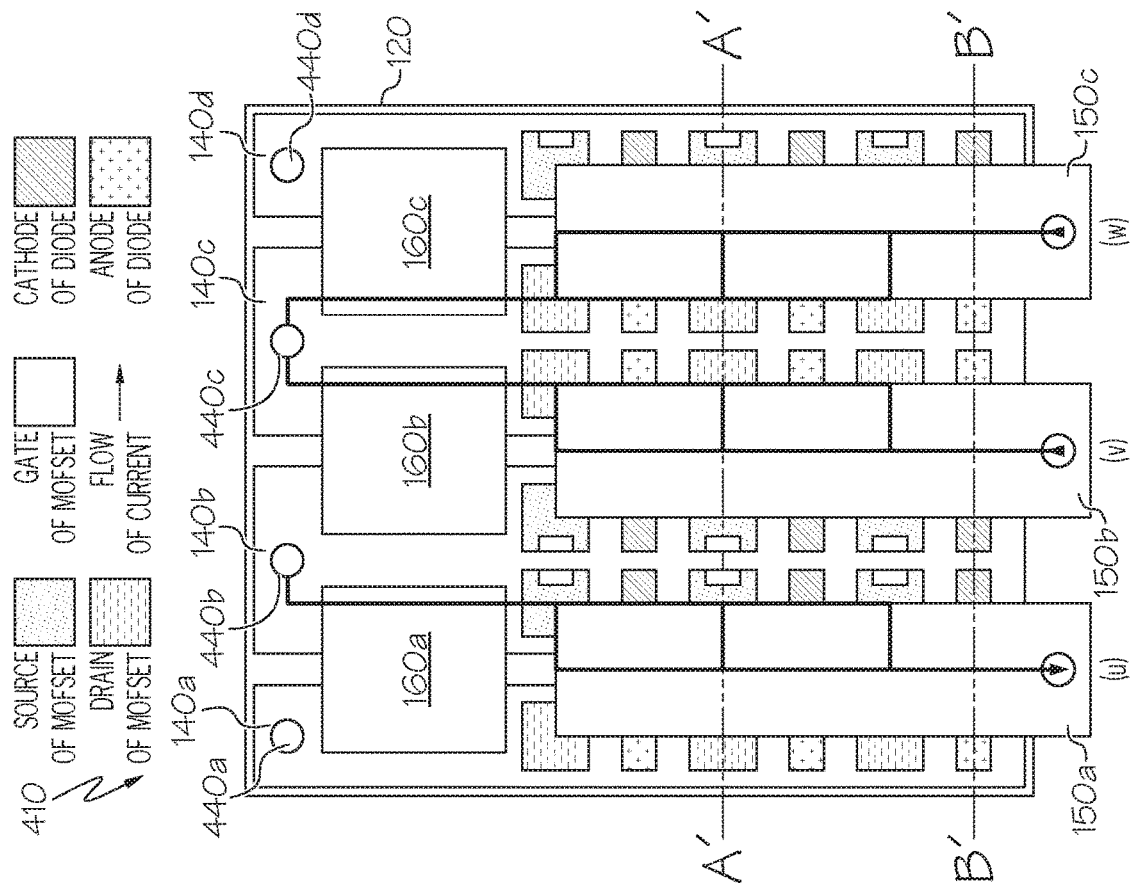
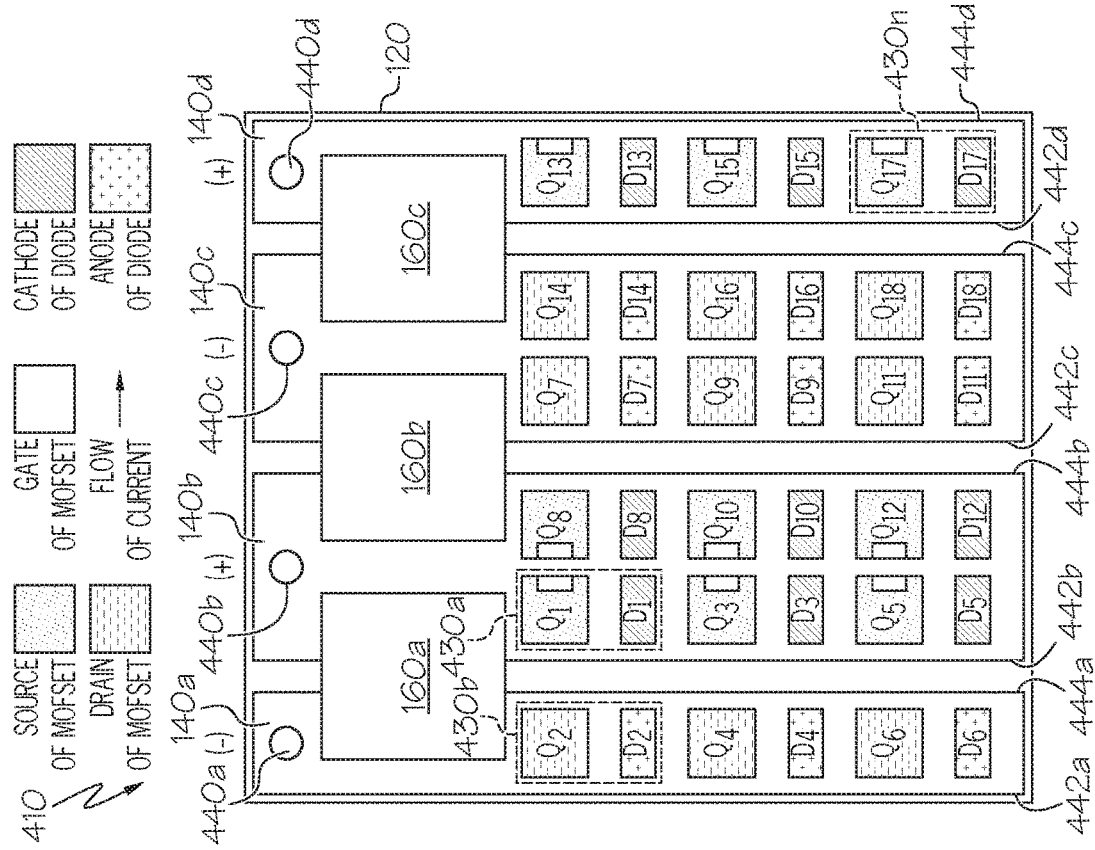
FIG. 6A
FIG. 6B

HIGH-DENSITY INTEGRATED POWER CONTROL ASSEMBLIES HAVING SHARED COOLING SYSTEM WITH A MOTOR

CROSS-REFERENCE TO RELATED APPLICATIONS

This application claims priority to U.S. Provisional Patent Application No. 62/911,719 entitled "High Density Integrated Power Modules With Cooling" and filed on Oct. 7, 2019, which is hereby incorporated by reference in its entirety.

TECHNICAL FIELD

The present specification generally relates to power control assemblies for motors in vehicles and, more specifically, to high-density integrated power control assemblies having a shared cooling system with motors in electrified vehicles.

BACKGROUND

Conventional motor drive systems in electrified vehicles (e.g., hybrid electric vehicles, plug-in hybrid electric vehicles, fuel cell vehicles, and electric vehicles) consist of three parts—the motor, the power control unit (PCU) and the high voltage cables. In this type of system, the motor and its corresponding PCU are designed and installed separately. However, the power density is limited due to the existence of cables and separated enclosures. The interconnecting cables produce extra power loss, weight, and volume, reducing the system efficiency. The cooling systems are designed separately for the motor and PCU, thereby increasing the complexity of the cooling system.

Additionally, as power control assemblies (for example, inverter circuits) are designed to operate at increased power levels and current densities, they generate high heat flux. This means that the printed circuit board (PCB) and the active and passive components disposed thereon in the power control assembly should be able to withstand higher temperatures and thermally induced stresses. Conventional heat sinks may be unable to remove sufficient heat to effectively lower the operating temperature of the power control assemblies to acceptable temperature levels. Further, conventional heat sinks and cooling structures may require additional bonding layers and thermal matching materials (e.g., bond layers, substrates, thermal interface materials). These additional layers and other factors add packaging size and substantial thermal resistance to the power control assemblies and make their thermal management challenging.

Accordingly, it is desirable to have high-density integrated power control assemblies configured to efficiently remove high heat flux therefrom.

SUMMARY

The present specification relates to high-density integrated power control assemblies having a shared cooling system with motors in electrified vehicles. In one embodiment, an integrated power control assembly configured as an inverter for a motor having three phases, is disclosed. The integrated power control assembly is mounted directly on an axial end of the motor. The integrated power control assembly includes a substrate, four input busbars laterally spaced apart on the substrate, a plurality of sets of paired devices, and three output busbars corresponding to the three phases of the motor, wherein a set of paired devices includes a switching semiconductor and a diode. The four input busbars include two input busbars of positive polarity arranged alternatively with two input busbars of negative polarity. Inner input busbars of opposite polarity are arranged between outer input busbars of opposite polarity. An inner input busbar has an edge adjacent to an inner input busbar of opposite polarity and an edge adjacent to an outer input busbar of opposite polarity. The inner input busbars are configured to have at least twice as many devices disposed thereon as the outer input busbars. One or more sets of paired devices are disposed axially on individual outer input busbars as well as on an individual inner input busbar along the edge adjacent to the outer input busbar of opposite polarity and along the edge adjacent to the outer input busbar of opposite polarity. An individual output busbar is disposed over and electrically coupled to one or more sets of paired devices disposed on adjacent input busbars of opposite polarity.

In another embodiment, a motor assembly comprising a three-phase motor, an integrated power control assembly configured as an inverter for the three-phase motor, and a shared cooling system thermally connecting the three-phase motor and the integrated power control assembly, is disclosed. The integrated power control assembly is mounted directly on an axial end of the motor. The integrated power control assembly includes a substrate, four input busbars laterally spaced apart on the substrate, a plurality of sets of paired devices, and three output busbars corresponding to the three phases of the motor, wherein a set of paired devices includes a switching semiconductor and a diode. The four input busbars include two input busbars of positive polarity arranged alternatively with two input busbars of negative polarity. Inner input busbars of opposite polarity are arranged between outer input busbars of opposite polarity. An inner input busbar has an edge adjacent to an inner input busbar of opposite polarity and an edge adjacent to an outer input busbar of opposite polarity. The inner input busbars are configured to have at least twice as many devices disposed thereon as the outer input busbars. One or more sets of paired devices are disposed axially on individual outer input busbars as well as on an individual inner input busbar along the edge adjacent to the outer input busbar of opposite polarity and along the edge adjacent to the outer input busbar of opposite polarity. An individual output busbar is disposed over and electrically coupled to one or more sets of paired devices disposed on adjacent input busbars of opposite polarity.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 6A schematically depicts a top view, without output connections, of the second embodiment of the example integrated power control assembly of FIG. 1, according to one or more embodiments shown and described herein;

FIG. 6B schematically depicts a top view, with output connections, of the second embodiment of the example integrated power control assembly of FIG. 1, according to one or more embodiments shown and described herein;

DETAILED DESCRIPTION

Various embodiments described herein are directed to high-density integrated power control assemblies having shared cooling system with motors in electrified vehicles. The integrated power control assemblies are configured to function as an inverter mounted directly on an axial end of an electric motor and share a cooling system with the electric motor. The integrated power control assemblies include two input busbars each of positive and negative polarities alternatively spaced apart on a substrate, wherein individual input busbars have a plurality of sets of paired devices disposed thereon. A set of paired devices includes a switching semiconductor device and a diode. Three output busbars corresponding to the three-phases of the electric motor are disposed over and electrically coupled to the plurality of sets of paired devices. A direct current (DC) signal received through the input busbars is converted to an alternating current (AC) signal by the plurality of sets of paired devices and outputted through the output busbars. The use and configuration of input busbars and output busbars in the integrated power control assemblies creates a compact wire-bondless package that reduces power loss, voltage spikes, and gate loop inductance, while also helping dissipate the heat generated during the operation of the devices. In some embodiments, the switching semiconductor devices and diodes on adjacent input busbars of opposite polarity are aligned in vertically opposite directions (i.e. physically flipped in orientation), which further enhances packing density and reduces packaging size. Finally, the use of a shared cooling system between the integrated power control assembly and the electric motor eliminates the need for separate cooling systems for the integrated power control assemblies. Various other aspects of the disclosure and variations thereof are illustrated or implied through the descriptions of the embodiments below.

Figure 1:
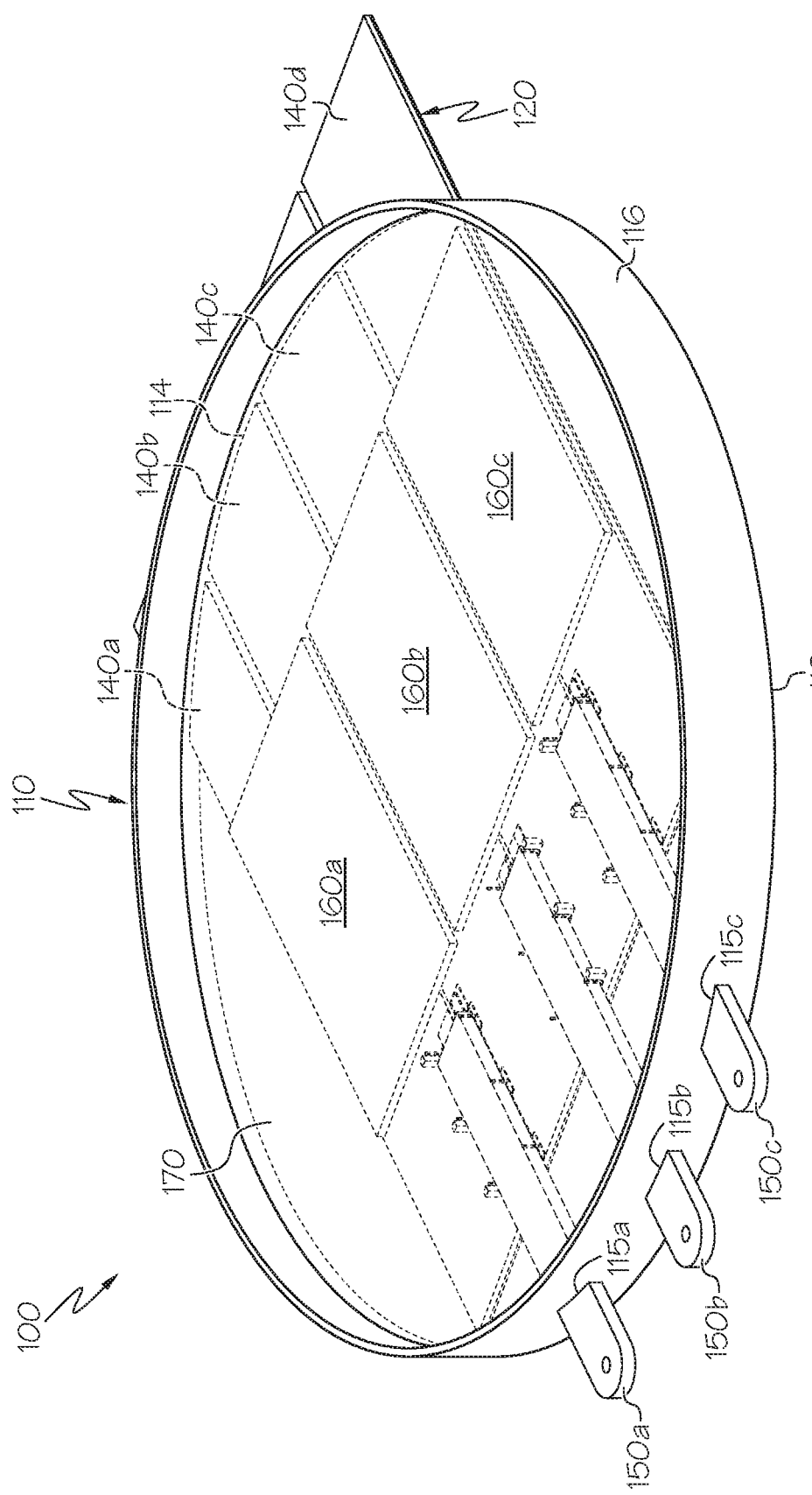
FIG. 1 depicts a perspective top view of an example integrated power control assembly, according to one or more embodiments shown and described herein.
Figure 2:
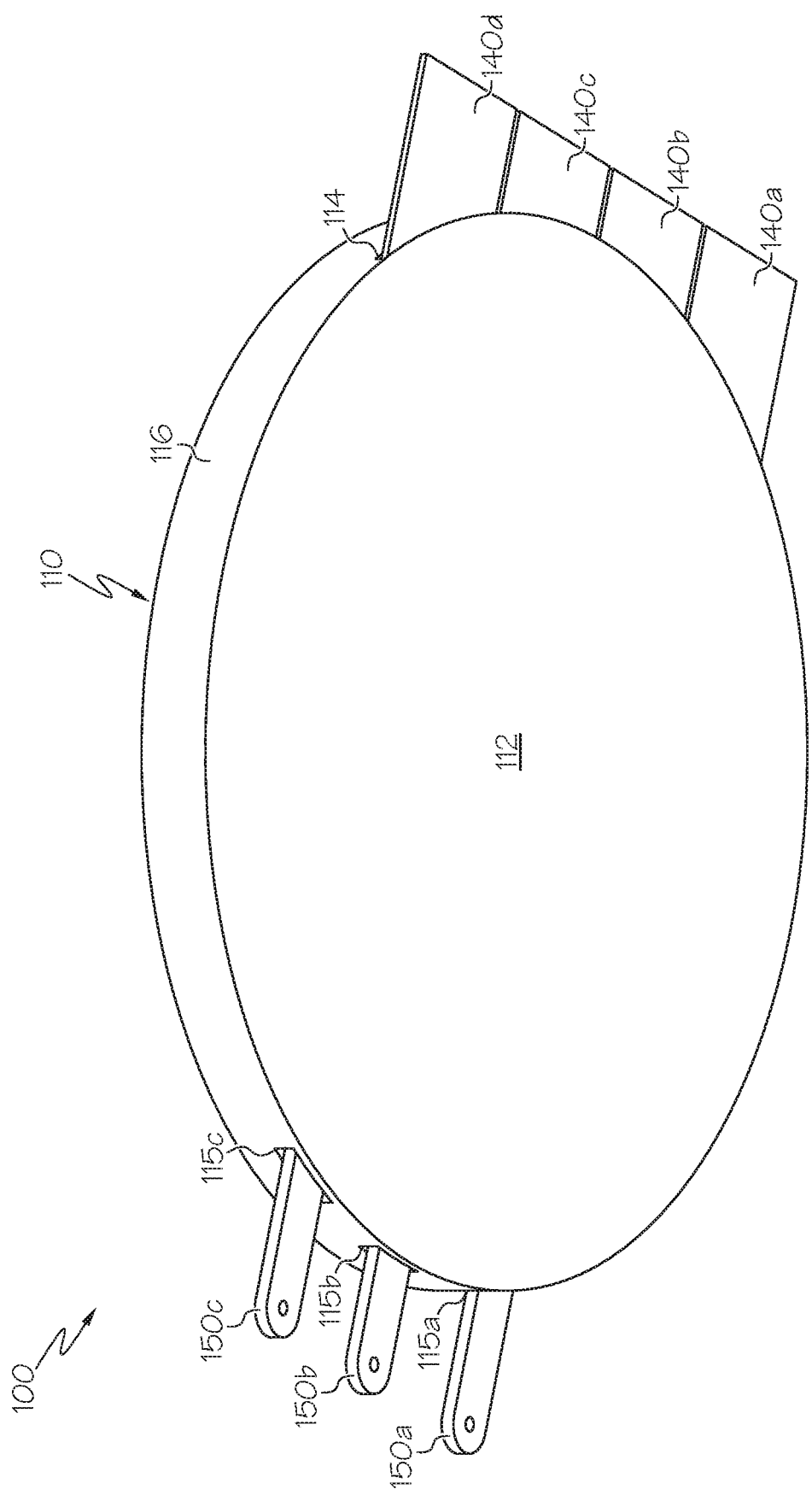
FIG. 2 depicts a perspective bottom view of the example integrated power control assembly of FIG. 1, according to one or more embodiments shown and described herein.

Referring to the figures, FIGS. 1-2 depict a perspective top view and a perspective bottom view of an example integrated power control assembly 100 configured as an inverter for a three-phase motor 320 (shown in FIGS. 3-4 and 9A-9B). However, in different embodiments, the example integrated power control assembly 100 may be configured as an inverter for a motor having two phases or more than three phases, without departing from the principle and scope of the disclosure. In the non-limiting example shown in FIGS. 1-2, the integrated power control assembly 100 is configured as a three-phase (U, V, W) inverter, which converts DC voltage into three sinusoidal AC waves of equal amplitude in three different phases U, V, and W respectively using Pulse Width Modulation (PWM) for the motor 320. In some embodiments, where the motor 320 has more than three phases, the integrated power control assembly 100 is configured to produce additional or alternative AC output(s) for redundancy.

The integrated power control assembly 100 includes a cylindrical ring-shaped metallic housing 110 having a bottom surface 112 and a sidewall 116. A substrate 120 having four input busbars 140a, 140b, 140c, and 140d laterally spaced apart thereon is accommodated into the housing 110 through an arc-shaped opening 114 along the sidewall 116. The four input busbars 140a, 140b, 140c, and 140d are configured to have three capacitors 160a, 160b, 160c as well as a number of devices disposed across them. While the three capacitors 160a, 160b, 160c are used in the non-limiting embodiment of FIG. 1, there may be one, two, or more than three capacitors of equivalent capacitance in other embodiments. Three output busbars 150a, 150b, 150c are electrically coupled to the four input busbars 140a, 140b, 140c, and 140d and the devices disposed thereon. The three output busbars 150a, 150b, 150c are accommodated out of the housing 110 through three rectangular openings 115a, 115b, 115c respectively. The three rectangular openings 115a, 115b, 115c are positioned on opposite ends of the sidewall 116. A printed circuit board (PCB) 170 is bonded (for example, using solder balls) over and across the three output busbars 150a, 150b, 150c and the three capacitors 160a, 160b, 160c within the housing 110.

The substrate 120 includes a thermal interface layer 730, a heat-spreading layer 720 disposed over the thermal interface layer 730, and an electrical isolation layer 710, as shown in FIGS. 7A-7B and 8A-8B. The thermal interface layer 730 is formed from a thermal interface material (TIM) such as, but not limited to, silicon for enhanced thermal connection. The heat-spreading layer 720 is formed from an electrically conductive material such as, but not limited to, copper, aluminum, nickel, and the like. The electrical isolation layer 710 is formed from an electrically isolating material such as, but not limited to, aluminum nitride.

The four input busbars 140a, 140b, 140c, and 140d and the three output busbars 150a, 150b, 150c are formed from an electrically conductive material such as, but not limited to, copper, aluminum, nickel, and the like. In some embodiments, the PCB 170 may be composed of a flame-retardant composite material formed from glass fiber reinforced epoxy resin such as, but not limited to, FR-4. In other embodiments, the PCB 170 may be composed of a ceramic material capable of withstanding temperatures in excess of 250° C. such as, but not limited to, an Low Temperature Co-fired Ceramic (LTCC) material or aluminum oxide.

Figure 3:
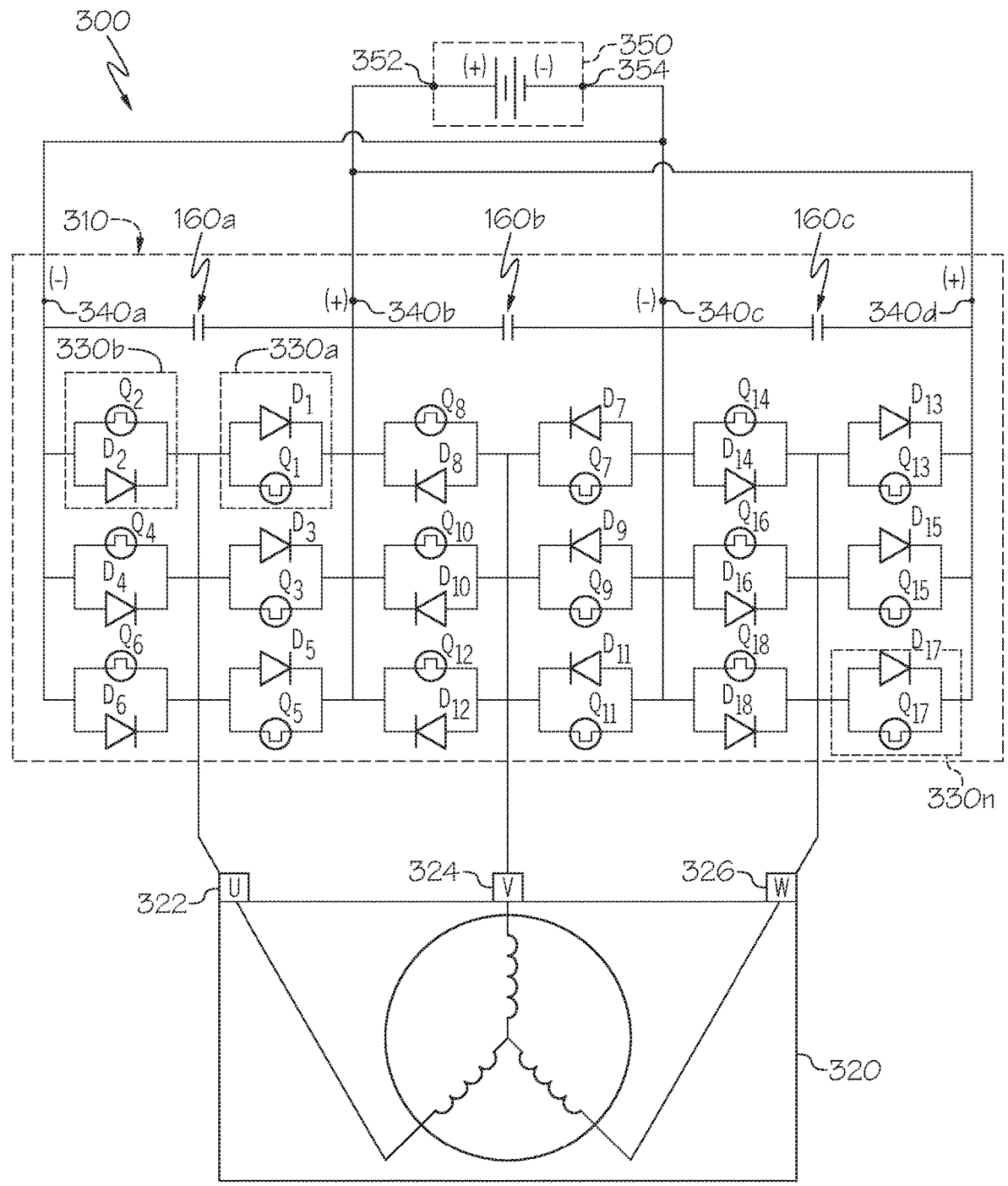
FIG. 3 depicts a circuit diagram of a motor assembly having a first embodiment of the example integrated power control assembly of FIG. 1, according to one or more embodiments shown and described herein.
Figure 5B:
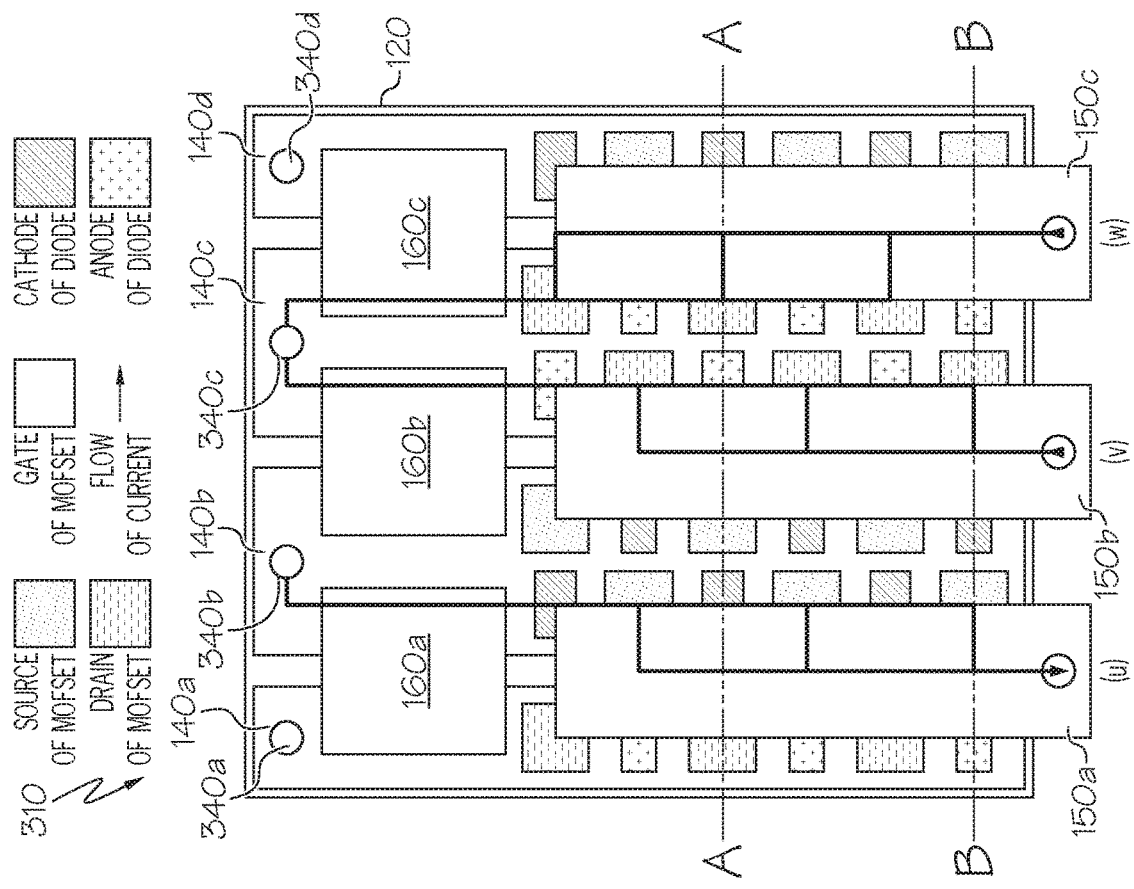
FIG. 5B schematically depicts a top view, with output connections, of the first embodiment of the example integrated power control assembly of FIG. 1, according to one or more embodiments shown and described herein.
Figure 5A:
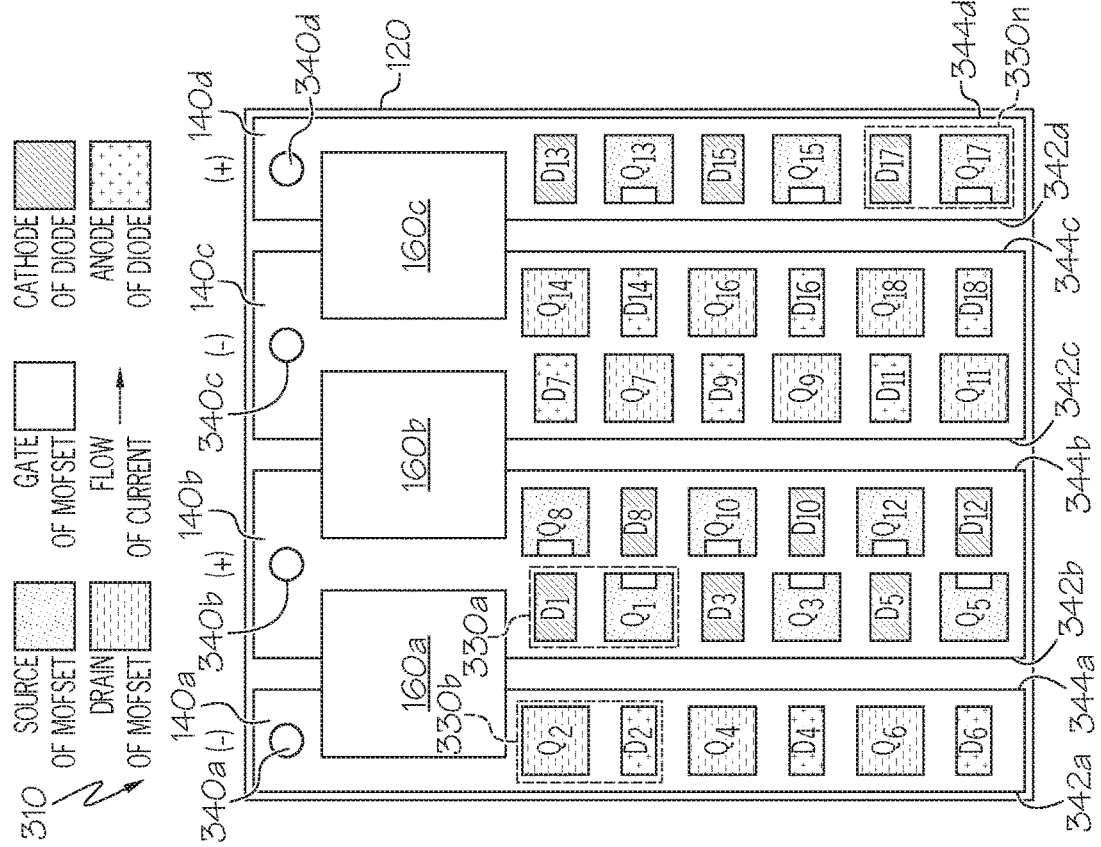
FIG. 5A schematically depicts a top view, without output connections, of the first embodiment of the example integrated power control assembly of FIG. 1, according to one or more embodiments shown and described herein.
Figure 7A:
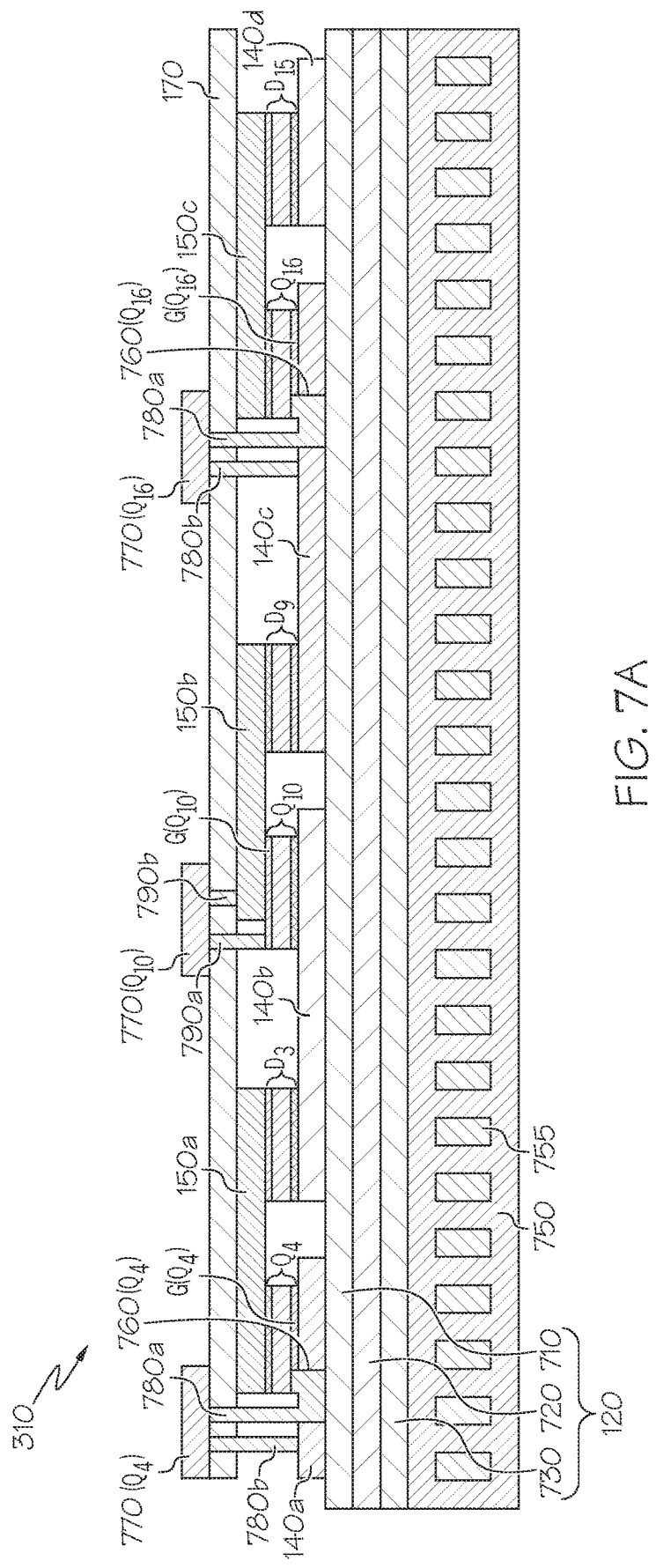
FIG. 7A depicts a side cross-sectional view along a sectional axis A-A of the first embodiment of the example integrated power control assembly of FIG. 5B, according to one or more embodiments shown and described herein.
Figure 7B:
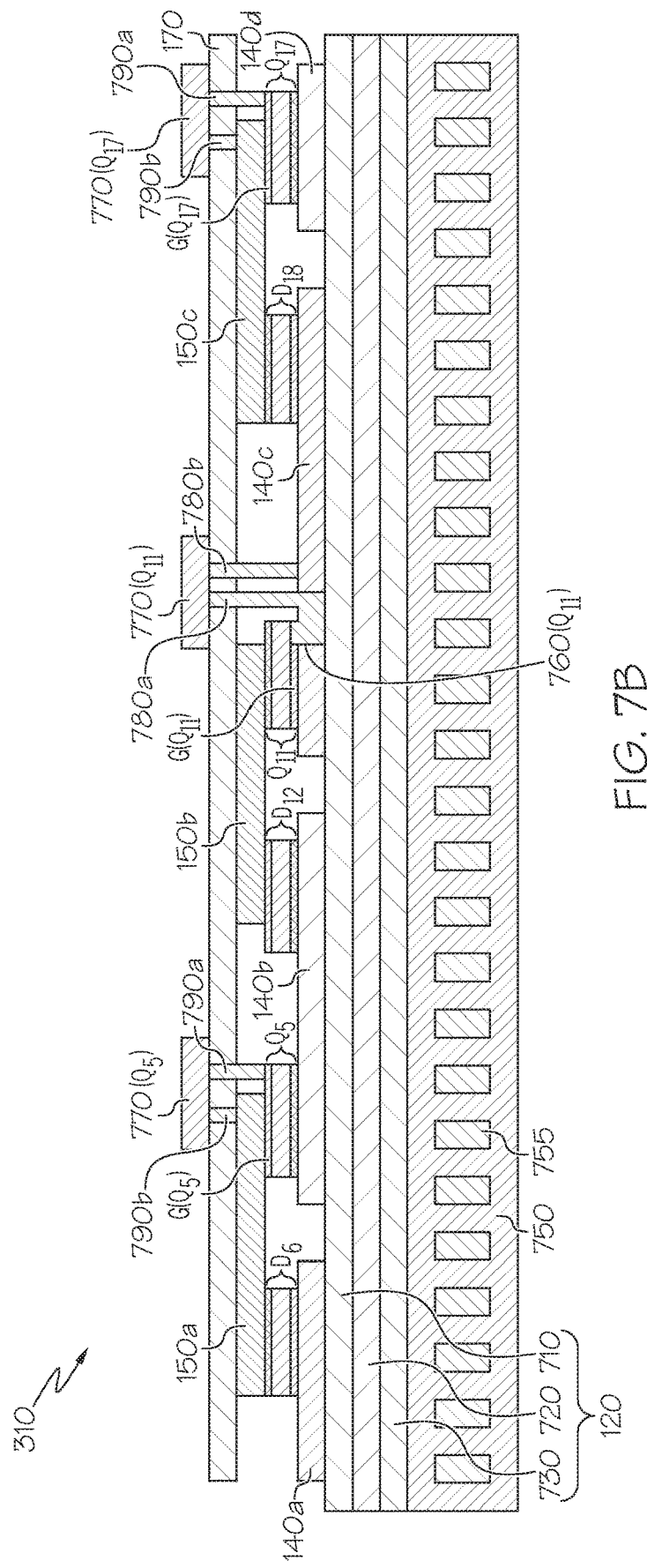
FIG. 7B depicts a side cross-sectional view along a sectional axis B-B of the first embodiment of the example integrated power control assembly of FIG. 5B, according to one or more embodiments shown and described herein.

FIG. 3 depicts a circuit diagram of a motor assembly 300 having a first embodiment of the example integrated power control assembly 310, whereas FIGS. 5A-5B schematically depict corresponding top views thereof, without and with output connections. Thus, FIG. 5A shows a top view of the integrated power control assembly 310 without the three output busbars 150a, 150b, 150c and the PCB 170. FIG. 5B shows the integrated power control assembly 310 with the three output busbars 150a, 150b, 150c disposed thereon but still without the PCB 170. FIGS. 7A-7B depict side cross-sectional views along sectional axes A-A and B-B respectively in FIG. 5B of the first embodiment of the example integrated power control assembly 310. FIGS. 7A-7B additionally show how the PCB 170 is disposed over the three output busbars 150a, 150b, 150c in the integrated power control assembly 310.

As shown in FIG. 3, the integrated power control assembly 310 is electrically connected between a battery 350 and the motor 320 having a U-phase AC input 322, a V-phase AC input 324, and a W-phase AC input 326. In this first embodiment, integrated power control assembly 310 includes a plurality of sets of paired devices 330a, 330b, . . . , 330n—each set having a switching semiconductor device (for example, $Q_1$, $Q_2$, etc.) electrically connected to a diode (for example, $D_1$, $D_2$, etc.)—receiving DC input from the battery 350 and providing AC output to the motor 320, wherein a switching semiconductor device and a diode in a first set of paired devices is laterally adjacent to a diode and a switching semiconductor device respectively in a second set of paired devices laterally adjacent to the first set of paired devices. For example, a diode $D_1$ of a first set 330a is laterally adjacent to a switching semiconductor device $Q_2$ of a second set 330b and a switching semiconductor device $Q_1$ of the first set 330a is laterally adjacent to a diode $D_2$ of the second set 330b, where 330a and 330b are laterally adjacent sets of paired devices.

Further, DC input current flowing into an individual set of paired devices 330a, 330b, . . . , 330n flows through either of two positive terminals 340b, 340d electrically connected to a positive terminal 352 of the battery 350 or either of two negative terminals 340a, 340c electrically connected to a negative terminal 354 of the battery 350. For example, the first set 330a receives DC input current from the battery through the negative terminal 340a, while the second set 330b receives DC input current from the battery through the positive terminal 340b. Finally, AC output current flowing out of adjacent sets of paired devices 330a, 330b, . . . , 330n are joined to be delivered to the U-phase AC input 322, the V-phase AC input 324, or the W-phase AC input 326. For example, the AC output current from the first set 330a and the second set 330b are joined to be delivered to the U-phase AC input 322.

FIG. 3 also shows the capacitors 160a, 160b, 160c electrically coupled between the battery 350 and the DC input current flowing into the individual set of paired devices 330a, 330b, . . . , 330n. For example, the capacitor 160a is electrically coupled between the battery 350 and the DC input current flowing into the first set 330a and the second set 330b. The capacitors 160a, 160b, 160c are operable to smoothen and balance any voltage oscillations of DC input current from the battery 350 such that the switching semiconductor device(s) $Q_1$, $Q_2$, etc. in the sets of paired devices 330a, 330b, . . . , 330n can operate optimally to produce AC output. As noted above, in different embodiments, there may be one, two, or more than three capacitors of equivalent capacitance performing the same function of the three capacitors 160a, 160b, 160c.

As shown in FIGS. 5A-5B, the sets of paired devices 330a, 330b, . . . , 330n are disposed on the four input busbars 140a, 140b, 140c, 140d. The four input busbars 140a, 140b, 140c, 140d include two input busbars 140b, 140d of positive polarity arranged alternatively, on the substrate 120, with two input busbars 140a, 140c of negative polarity. The two input busbars 140b, 140d of positive polarity provide DC connection to the battery 350 (not shown in FIGS. 5A-5B) through the two positive terminals 340b, 340d, while the two input busbars 140a, 140c of negative polarity provide DC connection to the battery 350 (not shown in FIGS. 5A-5B) through the two negative terminals 340a, 340c. Thus, an inner input busbar 140b having a positive terminal 340b and an inner input busbar 140c having a negative terminal 340c are arranged between an outer input busbar 140a having a negative terminal 340a and an outer input busbar 140d having a positive terminal 340d.

The inner input busbar 140b of positive polarity has an edge 342b adjacent to the outer input busbar 140a of negative polarity and an edge 344b adjacent to the inner input busbar 140c of negative polarity. Similarly, the inner input busbar 140c of negative polarity has an edge 342c adjacent to the inner input busbar 140b of positive polarity and an edge 344c adjacent to the outer input busbar 140d of positive polarity. Thus, individual inner input busbars 140b, 140c of positive and negative polarities have edges 344b, 342c adjacent to inner input busbars 140c, 140b of negative and positive polarities respectively. Further, individual inner input busbars 140b, 140c of positive and negative polarities have edges 342b, 344c adjacent to outer input busbars 140a, 140d of negative and positive polarities respectively.

In the non-limiting example shown in FIGS. 5A-5B, one or more sets of paired devices 330a, 330b, . . . , 330n are disposed axially on individual outer input busbars 140a, 140d. One or more sets of paired devices 330a, 330b, . . . , 330n are disposed axially on individual inner input busbars 140b, 140c of positive and negative polarities along the edges 344b, 342c adjacent to inner input busbars 140c, 140b of negative and positive polarities respectively. Further, one or more sets of paired devices 330a, 330b, . . . , 330n are disposed axially on individual inner input busbars 140b, 140c of positive and negative polarities along the edges 342b, 344c adjacent to outer input busbars 140a, 140d of negative and positive polarities respectively. Thus, the inner input busbars 140b, 140c are configured to have at least twice as many devices disposed thereon as the outer input busbars 140a, 140d. As shown in the non-limiting embodiment of FIGS. 5A-5B, six sets of paired devices 330a, 330b, . . . , 330n, i.e. twelve devices are disposed on each inner input busbars 140b, 140c, while only three sets of paired devices 330a, 330b, . . . , 330n, i.e. six devices are disposed on each outer input busbars 140a, 140d. While in the embodiment shown in FIG. 5A-5B, thirty six devices—eighteen switching semiconductor devices and eighteen diodes—are disposed over and across the input busbars 140a 140b, 140c, 140d, more or less number of devices may be disposed in different embodiments.

In some embodiments, the switching semiconductor devices $Q_1$, $Q_2$, etc. on adjacent input busbars 140a, 140b/140b, 140c/140c, 140d of opposite polarity may be aligned in vertically opposite directions (i.e. physically flipped in orientation such that gates $G(Q_1)$, $G(Q_2)$, etc. of the respective switching semiconductor devices $Q_1$, $Q_2$, etc. are positioned on opposite surfaces of the respective switching semiconductor devices $Q_1$, $Q_2$, etc.) to reduce packaging size and enhance packing density. In other embodiments, the diodes $D_1$, $D_2$, etc. on adjacent input busbars 140a, 140b/140b, 140c/140c, 140d of opposite polarity may be additionally or alternatively aligned in vertically opposite directions (i.e. physically flipped in orientation) to reduce packaging size and enhance packing density.

As shown in FIG. 5B, the three output busbars 150a, 150b, 150c are disposed over one or more sets of paired devices 330a, 330b, . . . , 330n across the four input busbars 140a, 140b, 140c, 140d. An individual output busbar 150a/150b/150c is electrically coupled to one or more sets of paired devices 330a, 330b, . . . , 330n disposed across adjacent input busbars 140a, 140b/140b, 140c/140c, 140d of opposite polarity. An individual output busbar 150a/150b/150c provides AC output connection corresponding to an individual phase of the three phases U, V, W of the motor 320 (not shown in FIGS. 5A-5B). Finally, as shown in FIGS. 5A-5B, the capacitors 160a, 160b, 160c are disposed across the four input busbars 140a, 140b, 140c, 140d such that an individual capacitor 160a/160b/160c is disposed across adjacent input busbars 140a, 140b/140b, 140c/140c, 140d of opposite polarity.

The switching semiconductor devices $Q_1$, $Q_2$, etc. enable the flow of AC current output into the motor 320 through the output busbars 150a, 150b, 150c, when the motor 320 is turned on. The switching semiconductor devices $Q_1$, $Q_2$, etc. may be one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof (e.g., power cards). In some embodiments, the switching semiconductor devices $Q_1$, $Q_2$, etc. may include a wide-bandgap semiconductor, and may be formed from any suitable material such as, but not limited to, silicon carbide (SiC), silicon dioxide (SiO2), aluminum nitride (AlN), gallium nitride (GaN), and boron nitride (BN), and the like. In some embodiments, switching semiconductor devices $Q_1$, $Q_2$, etc. operate at high current and under high temperatures, for example in excess of 250° C. and generate a large amount of heat that must be removed for the continued operation of the example integrated power control assembly 100. The diodes $D_1$, $D_2$, etc. enable the flow of DC current back into the battery 350 through the input busbars 140a, 140b, 140c, 140d, when the motor 320 is turned off.

FIG. 7A depicts a cross-sectional view of the integrated power control assembly 310 along a sectional axis A-A of FIG. 5B. The sectional axis A-A cuts through switching semiconductor devices $Q_4$, $Q_{10}$, $Q_{16}$ and diodes $D_3$, $D_9$, $D_{15}$ mounted on the four input busbars 140a, 140b, 140c, 140d disposed on the substrate 120. The switching semiconductor device $Q_4$ is disposed on the outer input busbar 140a, the diode $D_3$ and the switching semiconductor device $Q_{10}$ are disposed on the inner input busbar 140b, the diode $D_9$ and the switching semiconductor device $Q_{16}$ are disposed on the inner input busbar 140c, and the diode $D_{15}$ is disposed on the outer input busbar 140d. The switching semiconductor device $Q_4$ and the diode $D_3$ provide output to the output busbar 150a disposed thereon. The switching semiconductor device $Q_{10}$ and the diode $D_9$ provide output to the output busbar 150b disposed thereon. The switching semiconductor device $Q_{16}$ and the diode $D_{15}$ provide output to the output busbar 150c disposed thereon. In some embodiments, a bonding agent such as, but not limited to, copper bonding paste or solder, may be used to bond the switching semiconductor devices $Q_4$, $Q_{10}$, $Q_{16}$ to the corresponding input busbars 140a, 140b, 140c, 140d and output busbars 150a, 150b, 150c. The PCB 170 is disposed over and across the three output busbars 150a, 150b, 150c. The PCB 170 has a plurality of gate drive devices 770 disposed thereon for operably controlling every switching semiconductor device $Q_1$, $Q_2$, etc. on the integrated power control assembly 310. As shown in FIG. 7A, three gate drive devices 770($Q_4$), 770($Q_{10}$), and 770($Q_{16}$) are disposed on the PCB 170 for operably controlling the switching semiconductor devices $Q_4$, $Q_{10}$, $Q_{16}$ respectively.

The gate drive device 770($Q_{10}$) corresponding to the switching semiconductor device $Q_{10}$ disposed on the inner input busbar 140b of positive polarity is electrically connected to a gate $G(Q_{10})$ of the switching semiconductor device $Q_{10}$ disposed between the switching semiconductor device $Q_{10}$ and the output busbar 150b through a first electrically conductive via 790a disposed through the PCB 170 for driving the gate drive signal. The gate drive device 770($Q_{10}$) is electrically grounded to the output busbar 150b through a second electrically conductive via 790b disposed through the PCB 170. In some embodiments, the first electrically conductive via 790a may be an electrically conductive post disposed between the PCB 170 and the gate $G(Q_{10})$ of the switching semiconductor device $Q_{10}$.

The gate drive devices 770($Q_4$), 770($Q_{16}$) corresponding to the switching semiconductor devices $Q_4$, $Q_{16}$ disposed on the input busbars 140a, 140c of negative polarity are electrically connected to gates $G(Q_4)$, $G(Q_{16})$ of the switching semiconductor devices $Q_4$, $Q_{16}$ disposed between the switching semiconductor devices $Q_4$, $Q_{16}$ and the input busbars 140a, 140c respectively through L-shaped electrically conductive vias 780a. Individual L-shaped electrically conductive vias 780a disposed through the PCB 170 and openings 760($Q_4$), 760($Q_{16}$) respectively are used for driving the gate drive signal instead of bond wires. The openings 760($Q_4$), 760($Q_{16}$) are shaped to accommodate the L-shaped electrically conductive vias 780a and formed by cutting holes within the input busbars 140a, 140c of negative polarity respectively in order to reveal the gate terminals of the switching semiconductor devices $Q_4$, $Q_{16}$. Further, the gate drive devices 770($Q_4$), 770($Q_{16}$) are electrically grounded to the input busbars 140a, 140c of negative polarity through a third electrically conductive via 780b disposed through the PCB 170.

FIG. 7B depicts a cross-sectional view of the integrated power control assembly 310 along a sectional axis B-B of FIG. 5B. The sectional axis B-B cuts through switching semiconductor devices $Q_5$, $Q_{11}$, $Q_{17}$ and diodes $D_6$, $D_{12}$, Dig mounted on the four input busbars 140a, 140b, 140c, 140d disposed on the substrate 120. The diode $D_6$ is disposed on the outer input busbar 140a, the switching semiconductor device $Q_5$ and the diode $D_{12}$ are disposed on the inner input busbar 140b, the switching semiconductor device $Q_{11}$ and the diode Dig are disposed on the inner input busbar 140c, and the switching semiconductor device $Q_{17}$ is disposed on the outer input busbar 140d. The diode $D_6$ and the switching semiconductor device $Q_5$ provide output to the output busbar 150a disposed thereon. The diode $D_{12}$ and the switching semiconductor device $Q_{11}$ provide output to the output busbar 150b disposed thereon. The diode $D_{18}$ and the switching semiconductor device $Q_{17}$ provide output to the output busbar 150c disposed thereon. As shown in FIG. 7A, three gate drive devices 770($Q_5$), 770($Q_{11}$), and 770($Q_{17}$) are disposed on the PCB 170 for operably controlling the switching semiconductor devices $Q_5$, $Q_{11}$, $Q_{17}$ respectively.

The gate drive devices 770($Q_5$), 770($Q_{17}$) corresponding to the switching semiconductor devices $Q_5$, $Q_{17}$ disposed on the input busbars 140b, 140d of positive polarity are electrically connected to gates $G(Q_5)$, $G(Q_{17})$ of the switching semiconductor devices $Q_5$, $Q_{17}$ disposed between the switching semiconductor devices $Q_5$, $Q_{17}$ and the output busbars 150b, 150d through the first electrically conductive vias 790a disposed through the PCB 170 for driving the gate drive signal. The gate drive devices 770($Q_5$), 770($Q_{17}$) are electrically grounded to the output busbars 150b, 150d through the second electrically conductive vias 790b disposed through the PCB 170. In some embodiments, the first electrically conductive via 790a may be an electrically conductive post disposed between the PCB 170 and the gates $G(Q_5)$, $G(Q_{17})$ of the switching semiconductor devices $Q_5$, $Q_{17}$.

The gate drive device 770($Q_{11}$) corresponding to the switching semiconductor device $Q_{11}$ disposed on the inner input busbar 140c of negative polarity is electrically connected to a gates $G(Q_{11})$ of the switching semiconductor device $Q_{11}$ disposed between the switching semiconductor devices $Q_{11}$ and the inner input busbar 140c respectively through the L-shaped electrically conductive via 780a. The individual L-shaped electrically conductive via 780a disposed through the PCB 170 and an opening 760($Q_{11}$) respectively is used for driving the gate drive signal instead of bond wires. The opening 760($Q_{11}$) is shaped to accommodate the L-shaped electrically conductive vias 780a and formed by cutting a hole within the inner input busbar 140c of negative polarity in order to reveal the gate terminal of the switching semiconductor devices $Q_1$'. Further, the gate drive device 770($Q_{11}$) is electrically grounded to the inner input busbar 140c of negative polarity through the third electrically conductive via 780b disposed through the PCB 170.

In the non-limiting example of FIGS. 7A-7B, the substrate 120 may be disposed over a cooling device 750 having a plurality of microchannels 755. In different embodiments, the substrate 120 may also be thermally connected to a shared liquid-cooled cooling system 950 (shown in FIG. 9A) or a shared air-cooled cooling system 960 (shown in FIG. 9B).

Figure 4:
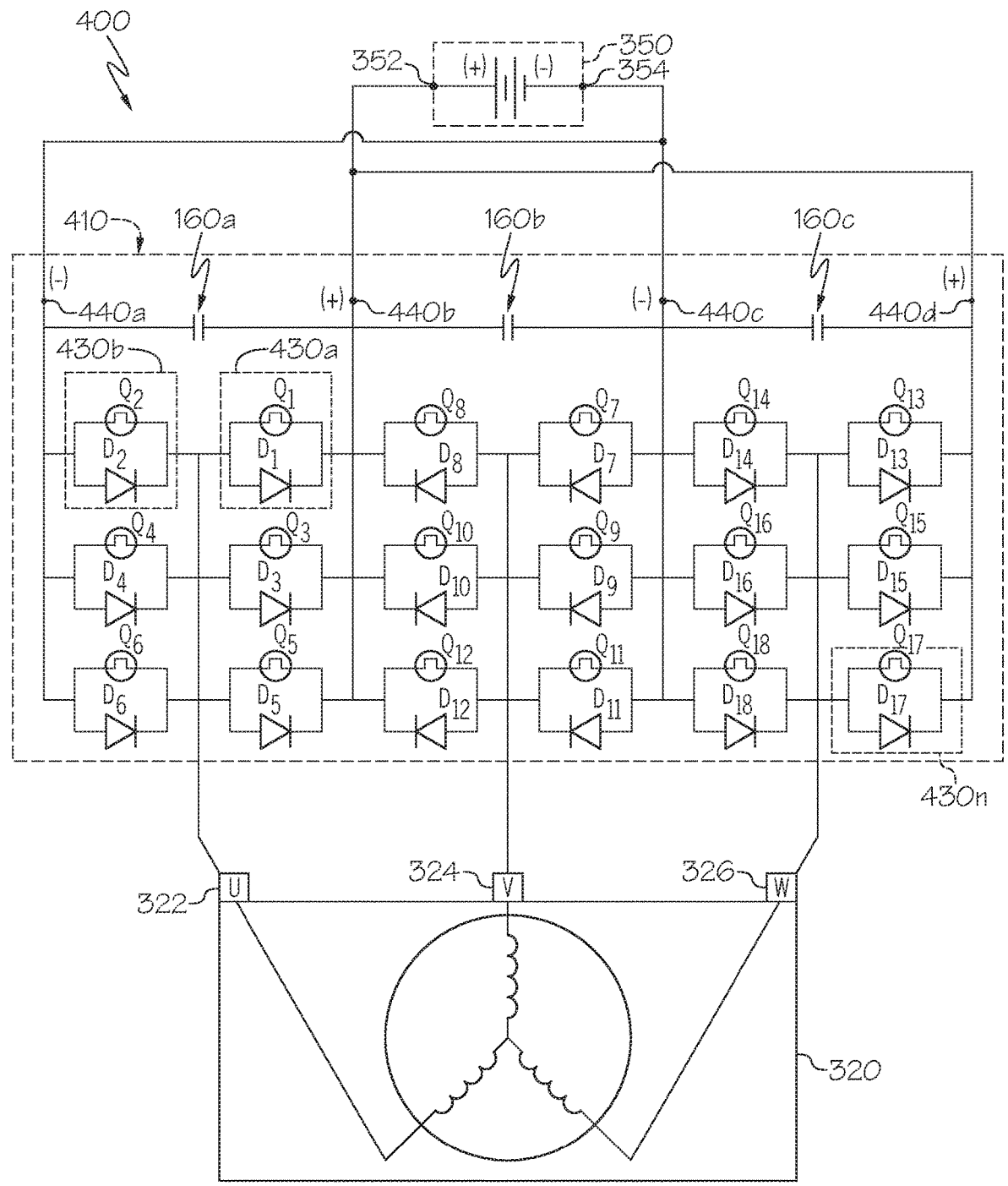
FIG. 4 depicts a circuit diagram of a motor assembly having a second embodiment of the example integrated power control assembly of FIG. 1, according to one or more embodiments shown and described herein.
Figure 8A:
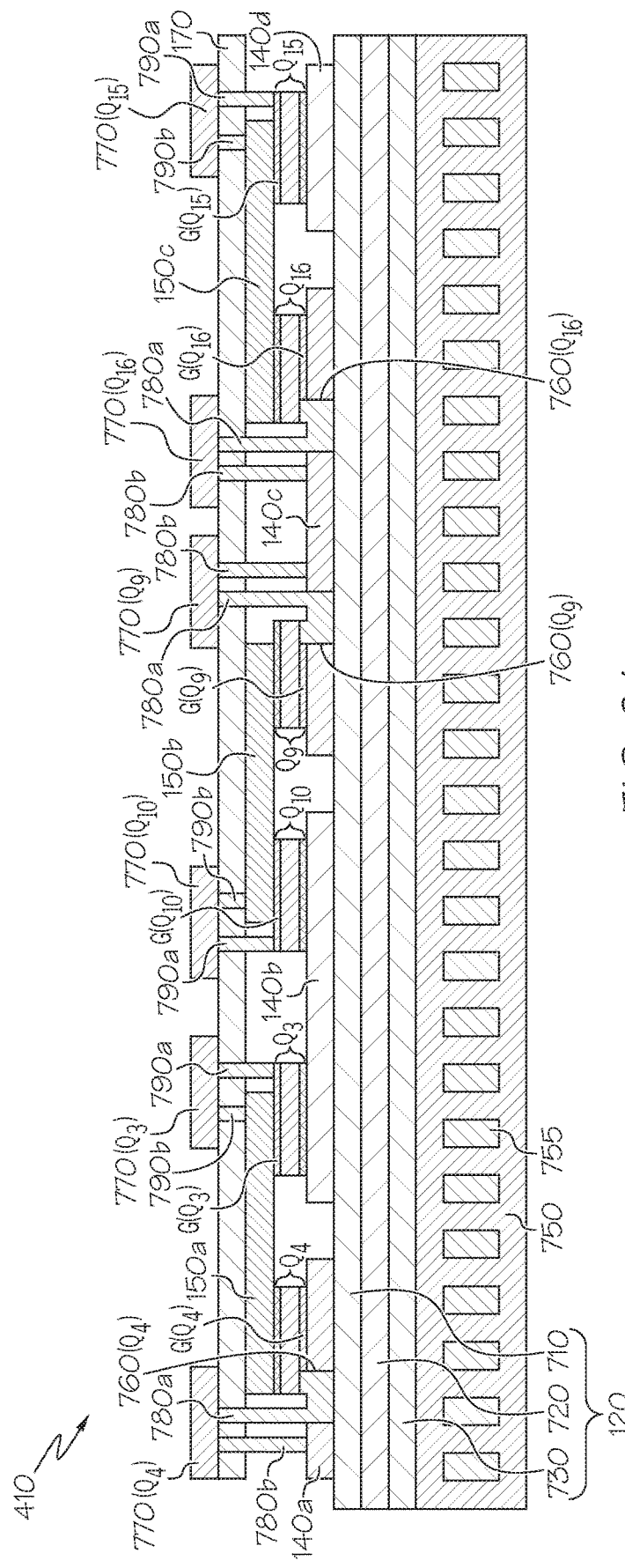
FIG. 8A depicts a side cross-sectional view along a sectional axis A'-A' of the second embodiment of the example integrated power control assembly of FIG. 6B, according to one or more embodiments shown and described herein.
Figure 8B:
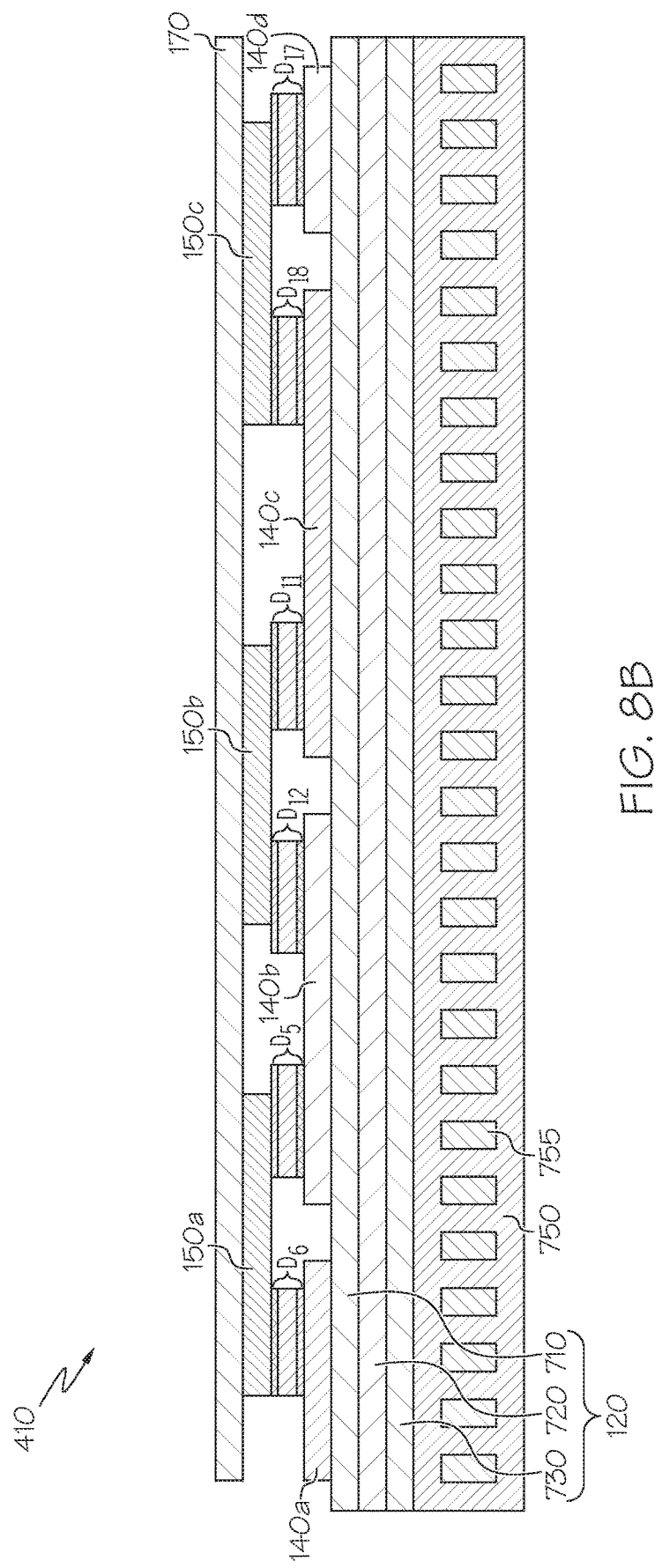
FIG. 8B depicts a side cross-sectional view along a sectional axis B'-B' of the second embodiment of the example integrated power control assembly of FIG. 6B, according to one or more embodiments shown and described herein.

FIG. 4 depicts a circuit diagram of a motor assembly 400 having a second embodiment of the example integrated power control assembly 410, whereas FIGS. 6A-6B schematically depict corresponding top views thereof, without and with output connections. Thus, FIG. 6A shows a top view of the integrated power control assembly 410 without the three output busbars 150a, 150b, 150c and the PCB 170. FIG. 6B shows the integrated power control assembly 410 with the three output busbars 150a, 150b, 150c disposed thereon but still without the PCB 170. FIGS. 8A-8B depict side cross-sectional views along sectional axes A'-A' and B'-B' respectively in FIG. 6B of the second embodiment of the example integrated power control assembly 410. FIGS. 8A-8B additionally show how the PCB 170 is disposed over the three output busbars 150a, 150b, 150c in the integrated power control assembly 410.

As shown in FIG. 4, the integrated power control assembly 410 is electrically connected between the battery 350 and the motor 320 having the U-phase AC input 322, the V-phase AC input 324, and the W-phase AC input 326. In this second embodiment, integrated power control assembly 410 includes the plurality of sets of paired devices 430a, 430b, ..., 430n—each set having a switching semiconductor device (for example, $Q_1$, $Q_2$, etc.) electrically connected to a diode (for example, $D_1$, $D_2$, etc.)—receiving DC input from the battery 350 and providing AC output to the motor 320, wherein a switching semiconductor device and a diode in a first set of paired devices is laterally adjacent to a switching semiconductor device and a diode respectively in a second set of paired devices laterally adjacent to the first set of paired devices. For example, a diode $D_1$ of a first set 430a is laterally adjacent to a diode $D_2$ of a second set 430b and a switching semiconductor device $Q_1$ of the first set 430a is laterally adjacent to a switching semiconductor device $Q_2$ of the second set 430b, where 430a and 430b are laterally adjacent sets of paired devices.

Further, DC input current flowing into an individual set of paired devices 430a, 430b, ..., 430n flows through either of two positive terminals 440b, 440d electrically connected to a positive terminal 352 of the battery 350 or either of two negative terminals 440a, 440c electrically connected to a negative terminal 354 of the battery 350. For example, the first set 430a receives DC input current from the battery 350 through the negative terminal 440a, while the second set 430b receives DC input current from the battery 350 through the positive terminal 440b. Finally, AC output current flowing out of adjacent sets of paired devices 430a, 430b, ..., 430n are joined to be delivered to the U-phase AC input 322, the V-phase AC input 324, or the W-phase AC input 326. For example, the AC output current from the first set 430a and the second set 430b are joined to be delivered to the U-phase AC input 322.

FIG. 4 also shows the capacitors 160a, 160b, 160c electrically coupled between the battery 350 and the DC input current flowing into the individual set of paired devices 430a, 430b, ..., 430n. For example, the capacitor 160a is electrically coupled between the battery 350 and the DC input current flowing into the first set 430a and the second set 430b. The capacitors 160a, 160b, 160c are operable to smoothen and balance any voltage oscillations of DC input current from the battery 350 such that the switching semiconductor device(s) $Q_1$, $Q_2$, etc. in the sets of paired devices 430a, 430b, ..., 430n can operate optimally to produce AC output. As noted above, in different embodiments, there may be one, two, or more than three capacitors of equivalent capacitance performing the same function of the three capacitors 160a, 160b, 160c.

As shown in FIGS. 6A-6B, the sets of paired devices 430a, 430b, ..., 330n are disposed on the four input busbars—outer input busbar 140a having a negative terminal 440a, inner input busbar 140b having a positive terminal 440b, inner input busbar 140c having a negative terminal 440c, and outer input busbar 140d having a positive terminal 440a. The four input busbars 140a, 140b, 140c, 140d are arranged on the substrate 120 in a substantially similar way as shown in FIGS. 5A-5B and described above.

The inner input busbar 140b of positive polarity has an edge 442b adjacent to the outer input busbar 140a of negative polarity and an edge 444b adjacent to the inner input busbar 140c of negative polarity. Similarly, the inner input busbar 140c of negative polarity has an edge 442c adjacent to the inner input busbar 140b of positive polarity and an edge 444c adjacent to the outer input busbar 140d of positive polarity. Thus, individual inner input busbars 140b, 140c of positive and negative polarities have edges 444b, 442c adjacent to inner input busbars 140c, 140b of negative and positive polarities respectively. Further, individual inner input busbars 140b, 140c of positive and negative polarities have edges 442b, 444c adjacent to outer input busbars 140a, 140d of negative and positive polarities respectively.

In the non-limiting example shown in FIGS. 6A-6B, one or more sets of paired devices 430a, 430b, . . . , 430n are disposed axially on individual outer input busbars 140a, 140d. One or more sets of paired devices 430a, 430b, . . . , 430n are disposed axially on individual inner input busbars 140b, 140c of positive and negative polarities along the edges 444b, 442c adjacent to inner input busbars 140c, 140b of negative and positive polarities respectively. Further, one or more sets of paired devices 430a, 430b, . . . , 430n are disposed axially on individual inner input busbars 140b, 140c of positive and negative polarities along the edges 442b, 444c adjacent to outer input busbars 140a, 140d of negative and positive polarities respectively. Thus, the inner input busbars 140b, 140c are configured to have at least twice as many devices disposed thereon as the outer input busbars 140a, 140d. As shown in the non-limiting embodiment of FIGS. 6A-6B, six sets of paired devices 430a, 430b, . . . , 430n, i.e. twelve devices are disposed on each inner input busbars 140b, 140c, while only three sets of paired devices 430a, 430b, . . . , 430n, i.e. six devices are disposed on each outer input busbars 140a, 140d. While in the embodiment shown in FIG. 6A-6B, thirty six devices-eighteen switching semiconductor devices and eighteen diodes—are disposed over and across the input busbars 140a 140b, 140c, 140d, more or less number of devices may be disposed in different embodiments.

In some embodiments, the switching semiconductor devices $Q_1$, $Q_2$, etc. on adjacent input busbars 140a, 140b/140b, 140c/140c, 140d of opposite polarity may be aligned in vertically opposite directions (i.e. physically flipped in orientation such that gates $G(Q_1)$, $G(Q_2)$, etc. of the respective switching semiconductor devices $Q_1$, $Q_2$, etc. are positioned on opposite surfaces of the respective switching semiconductor devices $Q_1$, $Q_2$, etc.) to reduce packaging size and enhance packing density. In other embodiments, the diodes $D_1$, $D_2$, etc. on adjacent input busbars 140a, 140b/140b, 140c/140c, 140d of opposite polarity may be additionally or alternatively aligned in vertically opposite directions (i.e. physically flipped in orientation) to reduce packaging size and enhance packing density. Finally, as shown in FIG. 6B, the three output busbars 150a, 150b, 150c are disposed over one or more sets of paired devices 430a, 430b, . . . , 430n across the four input busbars 140a, 140b, 140c, 140d in a substantially similar way as shown in FIGS. 5A-5B and described above.

FIG. 8A depicts a cross-sectional view of the integrated power control assembly 410 along a sectional axis A'-A' of FIG. 6B. The sectional axis A'-A' cuts through switching semiconductor devices $Q_4$, $Q_3$, $Q_{10}$, $Q_9$, $Q_{16}$ and $Q_{15}$ mounted on the four input busbars 140a, 140b, 140c, 140d disposed on the substrate 120. The switching semiconductor device $Q_4$ is disposed on the outer input busbar 140a, the switching semiconductor devices $Q_3$ and $Q_{10}$ are disposed on the inner input busbar 140b, the switching semiconductor devices $Q_9$ and $Q_{16}$ are disposed on the inner input busbar 140c, and the switching semiconductor device $Q_{15}$ is disposed on the outer input busbar 140d. The switching semiconductor devices $Q_4$ and $Q_3$ provide output to the output busbar 150a disposed thereon. The switching semiconductor devices $Q_{10}$ and $Q_9$ provide output to the output busbar 150b disposed thereon. The switching semiconductor device $Q_{16}$ and $Q_{15}$ provide output to the output busbar 150c disposed thereon. In some embodiments, a bonding agent such as, but not limited to, copper bonding paste or solder, may be used to bond the switching semiconductor devices $Q_4$, $Q_3$, $Q_{10}$, $Q_9$, $Q_{16}$ and $Q_{15}$ to the corresponding input busbars 140a, 140b, 140c, 140d and output busbars 150a, 150b, 150c. The PCB 170 is disposed over and across the three output busbars 150a, 150b, 150c. The PCB 170 has a plurality of gate drive devices 770 disposed thereon for operably controlling every switching semiconductor device $Q_1$, $Q_2$, etc. on the integrated power control assembly 310. The gate drive devices 770 may include one or more active components and be coupled to one or more passive components such as, but not limited to, capacitor(s), resistor(s), transformer(s) and inductor(s) disposed on the PCB 170. As shown in FIG. 8A, the gate drive devices 770($Q_4$), 770($Q_3$), 770($Q_{10}$), 770($Q_9$), 770($Q_{16}$) and 770($Q_{15}$) are disposed on the PCB 170 for operably controlling the switching semiconductor devices $Q_4$, $Q_3$, $Q_{10}$, $Q_9$, $Q_{16}$ and $Q_{15}$ respectively.

The gate drive devices 770($Q_3$), 770($Q_{10}$), and 770($Q_{15}$) corresponding to the switching semiconductor devices $Q_3$, $Q_{10}$ and $Q_{15}$ disposed on the input busbars 140b, 140b and 140d of positive polarity are electrically connected to gates $G(Q_3)$, $G(Q_{10})$, and $G(Q_{15})$ respectively of the switching semiconductor devices $Q_3$, $Q_{10}$ and $Q_{15}$ disposed between the switching semiconductor devices $Q_3$, $Q_{10}$ and $Q_{15}$ and the output busbars 150a, 150b, 150c respectively through the first electrically conductive vias 790a disposed through the PCB 170 for driving the gate drive signal. The gate drive devices 770($Q_3$), 770($Q_{10}$), and 770($Q_{15}$) are electrically grounded to the output busbars 150a, 150b, 150c through the second electrically conductive vias 790b disposed through the PCB 170. In some embodiments, the first electrically conductive via 790a may be an electrically conductive post disposed between the PCB 170 and the gates $G(Q_3)$, $G(Q_{10})$, and $G(Q_{15})$ of the switching semiconductor devices $Q_3$, $Q_{10}$ and $Q_{15}$ respectively.

The gate drive devices 770($Q_4$), 770($Q_9$), and 770($Q_{16}$) corresponding to the switching semiconductor devices $Q_4$, $Q_9$ and $Q_{16}$ disposed on the input busbars 140a, 140c, and 140c of negative polarity are electrically connected to gates $G(Q_4)$, $G(Q_9)$, and $G(Q_{16})$ respectively of the switching semiconductor devices $Q_4$, $Q_9$ and $Q_{16}$ disposed between the switching semiconductor devices $Q_4$, $Q_9$ and $Q_{16}$ and the input busbars 140a, 140c, and 140c respectively through the L-shaped electrically conductive vias 780a. Individual L-shaped electrically conductive vias 780a disposed through the PCB 170 and openings 760($Q_4$), 760($Q_9$), and 760($Q_{16}$) respectively, are used for driving the gate drive signal instead of bond wires. The openings 760($Q_4$), 760($Q_9$), and 760($Q_{16}$) are shaped to accommodate the L-shaped electrically conductive vias 780a and formed by cutting holes within the input busbars 140a, 140c, and 140c of negative polarity respectively in order to reveal the gate terminals of the switching semiconductor devices $Q_4$, $Q_9$, $Q_{16}$ respectively. Further, the gate drive devices 770($Q_4$), 770($Q_9$), and 770($Q_{16}$) are electrically grounded to the input busbars 140a, 140c, and 140c of negative polarity through the third electrically conductive vias 780b disposed through the PCB 170.

FIG. 8B depicts a cross-sectional view of the integrated power control assembly 410 along a sectional axis B'-B' of FIG. 6B. The sectional axis B'-B' cuts through diodes $D_6$, $D_5$, $D_{12}$, $D_{11}$, $D_{18}$ and $D_{17}$ mounted on the four input busbars 140a, 140b, 140c, 140d disposed on the substrate 120. The diode $D_6$ is disposed on the outer input busbar 140a, the diodes $D_5$ and $D_{12}$ are disposed on the inner input busbar 140b, the diodes $D_{11}$ and $D_{18}$ are disposed on the inner input busbar 140c, and the diode $D_{17}$ is disposed on the outer input busbar 140d. The diodes $D_6$ and $D_5$ are electrically connected to the output busbar 150a disposed thereon. The diodes $D_{12}$ and $D_{11}$ are electrically connected to the output busbar 150b disposed thereon. The diodes $D_{18}$ and $D_{17}$ are electrically connected to the output busbar 150c disposed thereon.

Figure 9A:
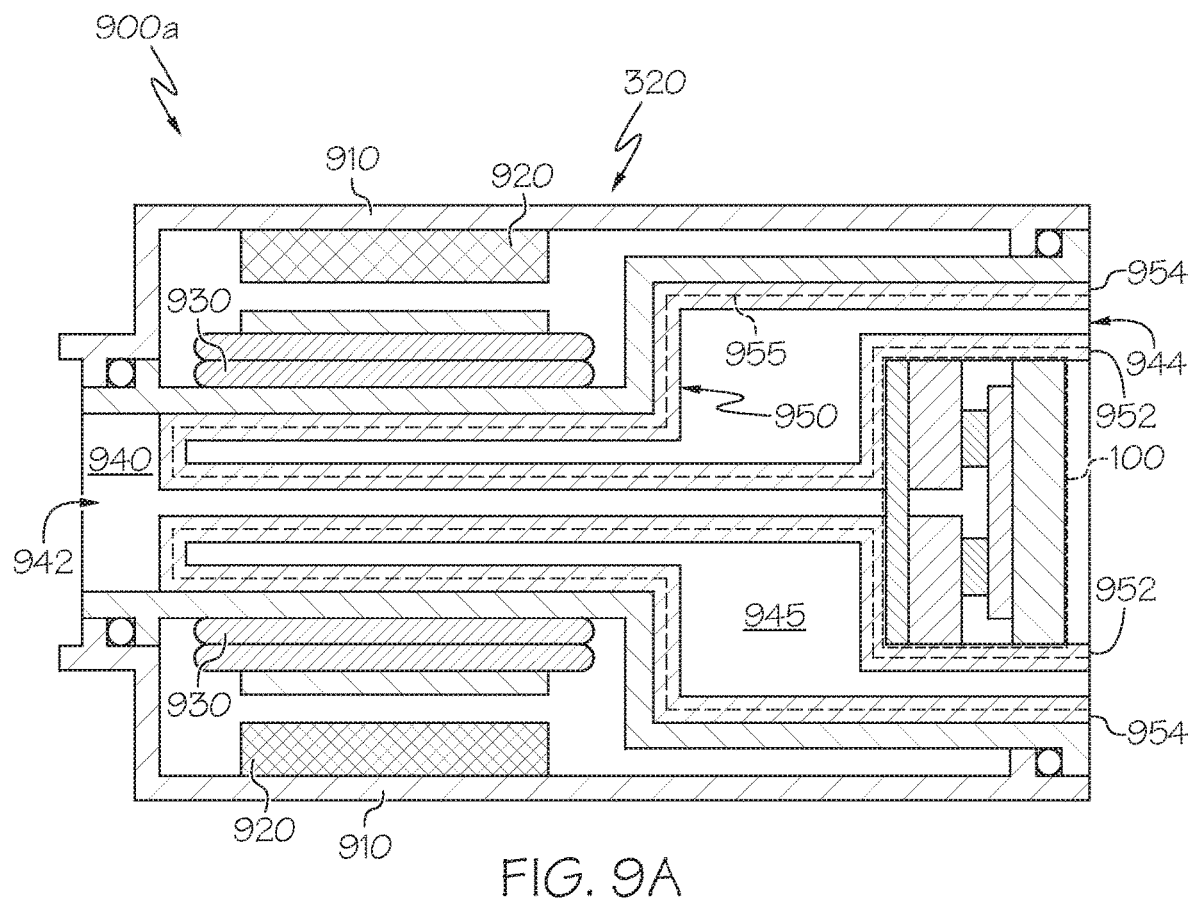
FIG. 9A schematically depicts a motor assembly having a shared liquid-cooled cooling system thermally connecting the example integrated power control assembly of FIG. 1 and a motor therein, according to one or more embodiments shown and described herein.

FIG. 9A schematically depicts a motor assembly 900a having a shared liquid-cooled cooling system 950 thermally connecting the motor 320 and the example integrated power control assembly 100 couple thereto. The motor 320 includes a rotor 920 and a stator 930 encased within a wall 910 of the motor assembly 900a. The motor assembly 900a has a first axial end 942, a second axial end 944 opposite to the first axial end 942, and a motor shaft 940 between the first axial end 942 and the second axial end 944. The motor shaft 940 opens into an aperture 945 towards the second axial end 944. The first axial end 942 is configured to be connected to a drive shaft and power transmission gear (not shown) of a vehicle 1000 (shown in FIG. 10). The integrated power control assembly 100 is mounted directly to the second axial end 944 of the motor 320.

The shared liquid-cooled cooling system 950 includes a fluid channel 955 disposed between a fluid inlet 952 and a fluid outlet 954. The fluid channel 955 is disposed within the aperture 945 around the integrated power control assembly 100 and the motor shaft 940. A cooling fluid flows through the fluid channel 955, directed by a pump (not shown) between the fluid inlet 952 and the fluid outlet 954. The cooling fluid is configured to absorb and transfer heat generated from the operation of the motor 320 and the integrated power control assembly 100. The cooling fluid may be an electrically conductive fluid, such as an ethylene glycol mixture, water, etc. or a dielectric cooling fluid that undergoes single-phase cooling. In some embodiments, the cooling fluid may undergo two-phase cooling by transforming from a liquid phase to a vapor phase.

Figure 9B:
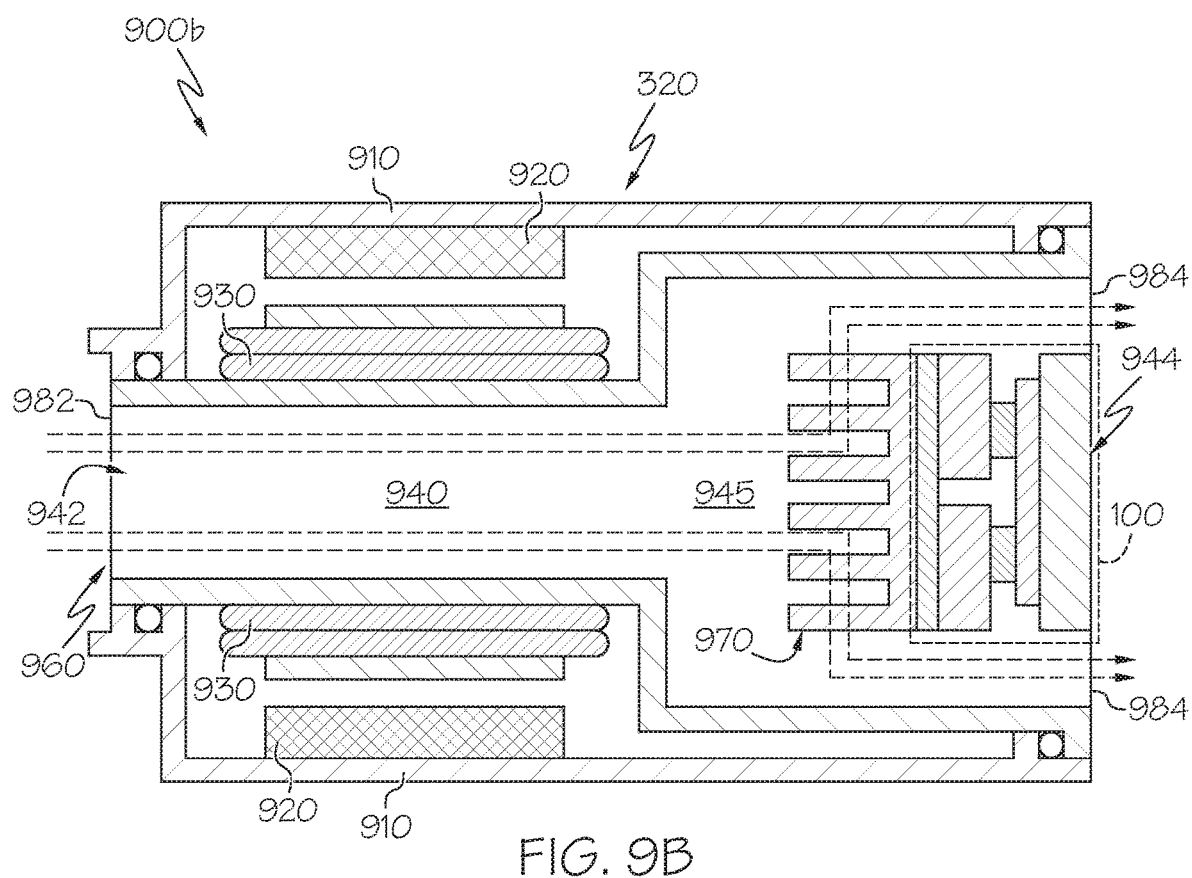
FIG. 9B schematically depicts a motor assembly having a shared air-cooled cooling system thermally connecting the example integrated power control assembly of FIG. 1 and a motor therein, according to one or more embodiments shown and described herein.

FIG. 9B schematically depicts a motor assembly 900b having a shared air-cooled cooling system 960 thermally connecting the motor 320 and the example integrated power control assembly 100 coupled thereto. The motor 320 includes the rotor 920 and the stator 930 encased within the wall 910 of the motor assembly 900b. The motor assembly 900b has the motor shaft 940 disposed between the first axial end 942 and the second axial end 944. The motor shaft 940 opens into an aperture 945 towards the second axial end 944. The first axial end 942 is configured to be connected to a drive shaft and power transmission gear (not shown) of a vehicle 1000 (shown in FIG. 10). The integrated power control assembly 100 is mounted directly to the second axial end 944 of the motor 320.

The shared air-cooled cooling system 960 includes a plurality of fins 970 coupled to the integrated power control assembly 100 within the aperture 945, an air inlet 982 at the first axial end 942 and an air outlet 984 at the second axial end 944. Cooling air flows from the air inlet 982 into the plurality of fins 970 and flows out of the air outlet 984. The cooling air is configured to absorb and transfer heat generated from the operation of the motor 320 and the integrated power control assembly 100.

Figure 10:
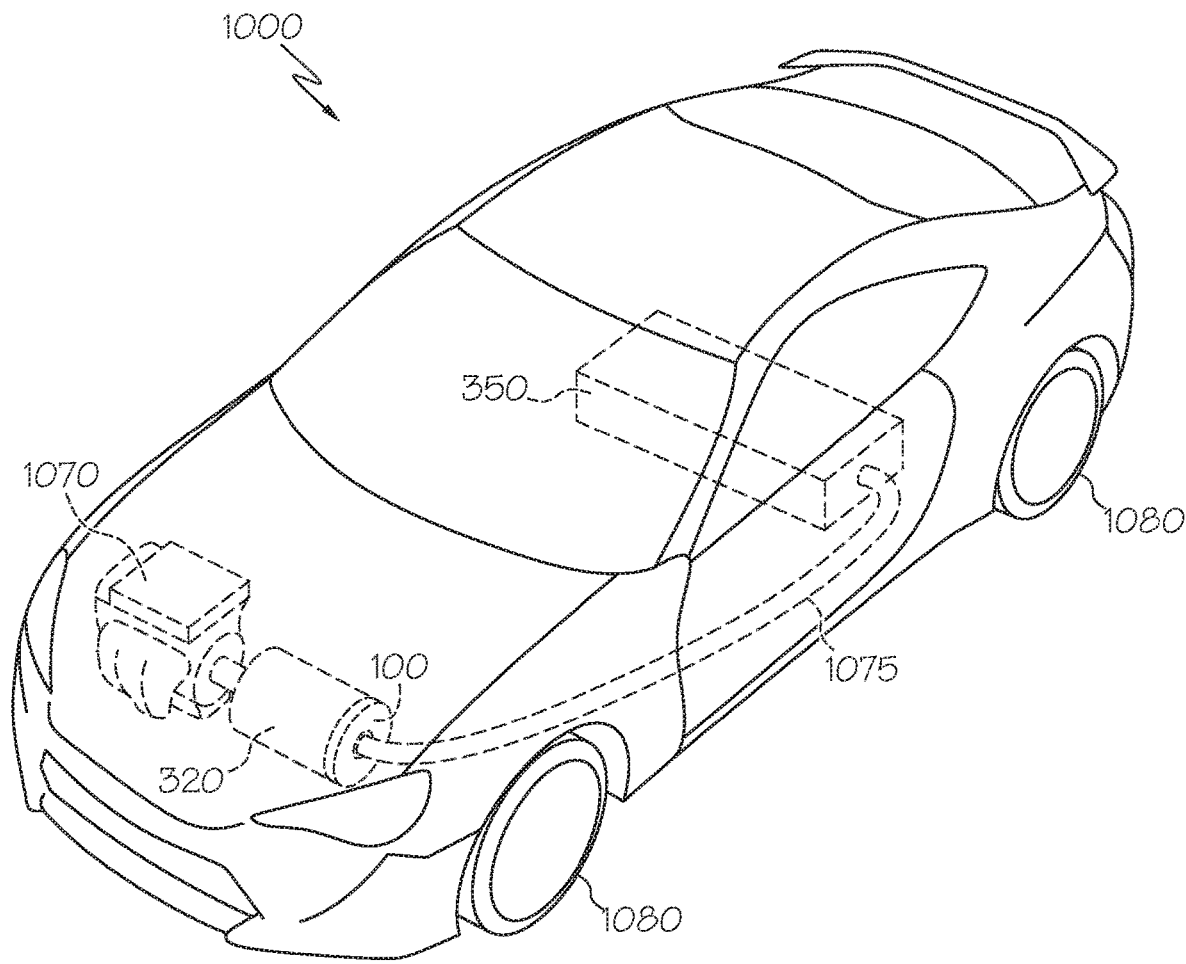
FIG. 10 schematically depicts an example electric vehicle having the example integrated power control assembly of FIG. 1, according to one or more embodiments shown and described herein.

As stated above, the integrated power control assemblies 100 described herein may be incorporated into motor assemblies 900a, 900b of a vehicle 1000. The vehicle 1000 may be a hybrid vehicle, a plug-in electric hybrid vehicle, an electric vehicle, or any vehicle that utilizes an electric motor. FIG. 10 schematically depicts the vehicle 1000 having the motor 320 electrically coupled to the example integrated power control assembly 100. The vehicle 1000 generally comprises a gasoline engine 1070 and the electric motor 320 described above, both of which are configured to provide rotational movement to the wheels 1080 of the vehicle 1000 to propel the vehicle 1000 down the road. The example integrated power control assembly 100 is mounted on an axial end of the electric motor 320 and configured as an inverter for the electric motor 320. The example integrated power control assembly 100 is in turn electrically coupled to the battery pack 350 as noted above by electrical connectors 1075.

The integrated power control assemblies 100 described herein can be advantageously configured to function as an inverter for an electric motor. The use of busbars shortens electrical connections and eliminates interconnecting high voltage cables to create a compactly-packaged inverter. Aside from the reduction in package size through removal of wire bonds, wirebondless packaging reduces the loop inductance, voltage spikes and switching power loss. In embodiments, where the switching semiconductor devices and diodes on adjacent input busbars of opposite polarity are aligned in vertically opposite directions (i.e. physically flipped in orientation), packing density is further enhanced. Finally, the use of a shared cooling system between the integrated power control assembly and the electric motor eliminates the need for separate cooling systems for the integrated power control assemblies. The use of busbars improves the thermal performance of the integrated power control assemblies as well by adding an additional rote of heat dissipation from the switching semiconductor devices. Overall, the design of the integrated power control assemblies becomes simplified through reduction in weight, volume, and cost of the powertrain used in electrified vehicles.

It is noted that the terms "substantially" and "about" may be utilized herein to include the inherent degree of uncertainty that may be attributed to any quantitative comparison, value, measurement, or other representation. These terms are also utilized herein to represent the degree by which a quantitative representation may vary from a stated reference without resulting in a change in the basic function and intended scope of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An integrated power control assembly configured as an inverter to be mounted directly on an axial end of a motor having three phases, the integrated power control assembly comprising:
a substrate;
four input busbars laterally spaced apart on the substrate, the four input busbars comprising two input busbars of positive polarity arranged alternatively with two input busbars of negative polarity, wherein:
inner input busbars of opposite polarity are arranged between outer input busbars of opposite polarity, an inner input busbar having an edge adjacent to an inner input busbar of opposite polarity and an edge adjacent to an outer input busbar of opposite polarity; and
the inner input busbars are configured to have at least twice as many devices disposed thereon as the outer input busbars;
one or more sets of paired devices disposed axially on the outer input busbars, wherein a set of paired devices comprises a switching semiconductor device and a diode;
one or more sets of paired devices disposed axially on the inner input busbar along the edge adjacent to the inner input busbar of opposite polarity;
one or more sets of paired devices disposed axially on the inner input busbar along the edge adjacent to the outer input busbar of opposite polarity; and
three output busbars corresponding to the three phases of the motor, an individual output busbar disposed over and electrically coupled to one or more sets of paired devices disposed on adjacent input busbars of opposite polarity.

2. The integrated power control assembly of claim 1 further comprising;
a circuit board disposed over and across the three output busbars, wherein the circuit board further comprises a gate drive device disposed thereon for operably controlling every switching semiconductor device in the integrated power control assembly.

3. The integrated power control assembly of claim 1 further comprising;
one or more capacitors disposed over and across the four input busbars, wherein an individual capacitor is electrically coupled to a battery.

4. The integrated power control assembly of claim 1, wherein a first switching semiconductor device and a first diode in a first set of paired devices are laterally adjacent to a second diode and a second switching semiconductor device in a second set of paired devices respectively, wherein the first set of paired devices and the second set of paired devices are laterally adjacent sets of paired devices.

5. The integrated power control assembly of claim 1, wherein a first switching semiconductor device and a first diode in a first set of paired devices are laterally adjacent to a second switching semiconductor device and a second diode in a second set of paired devices respectively, wherein the first set of paired devices and the second set of paired devices are laterally adjacent sets of paired devices.

6. The integrated power control assembly of claim 1, wherein switching semiconductor devices on adjacent input busbars of opposite polarity are aligned in vertically opposite directions such that gates of the switching semiconductor devices are positioned on opposite surfaces thereof.

7. The integrated power control assembly of claim 1, wherein diodes on adjacent input busbars of opposite polarity are aligned in vertically opposite directions.

8. The integrated power control assembly of claim 1, wherein the substrate comprises:
a thermal interface layer;
a heat-spreading layer disposed over the thermal interface layer, the heat-spreading layer formed from an electrically conductive material; and
an electrical-isolation layer.

9. The integrated power control assembly of claim 1, wherein:
a gate drive device corresponding to a switching semiconductor device disposed on an input busbar of positive polarity is electrically connected to a gate of the switching semiconductor device and grounded to a corresponding output busbar electrically coupled to the switching semiconductor device through electrically conductive vias disposed through the circuit board.

10. The integrated power control assembly of claim 1, wherein:
a gate drive device corresponding to a switching semiconductor device disposed on an input busbar of negative polarity is electrically connected to a gate of the switching semiconductor device through an L-shaped electrically conductive via disposed through the circuit board and an opening within the input busbar of negative polarity; and
the gate drive device is grounded to the input busbar of negative polarity through an electrically conductive via disposed through the circuit board.

11. A motor assembly comprising:
a three-phase motor; and
an integrated power control assembly configured as an inverter to be mounted directly on an axial end of the three-phase motor, the integrated power control assembly comprising:
a substrate;
four input busbars laterally spaced apart on the substrate, the four input busbars comprising two input busbars of positive polarity arranged alternatively with two input busbars of negative polarity, wherein:
inner input busbars of opposite polarity are arranged between outer input busbars of opposite polarity, an inner input busbar having an edge adjacent to an inner input busbar of opposite polarity and an edge adjacent to an outer input busbar of opposite polarity; and
the inner input busbars are configured to have at least twice as many devices disposed thereon as the outer input busbars;
one or more sets of paired devices disposed axially on the outer input busbars, wherein a set of paired devices comprises a switching semiconductor device and a diode;
one or more sets of paired devices disposed axially on the inner input busbar along the edge adjacent to the inner input busbar of opposite polarity;
one or more sets of paired devices disposed axially on the inner input busbar along the edge adjacent to the outer input busbar of opposite polarity; and
three output busbars corresponding to three phases of the three-phase motor, an individual output busbar disposed over and electrically coupled to one or more sets of paired devices disposed on adjacent input busbars of opposite polarity; and a shared cooling system thermally connecting the three-phase motor and the integrated power control assembly.

12. The motor assembly of claim 11, wherein the integrated power control assembly further comprises;
a circuit board disposed over and across the three output busbars, wherein the circuit board further comprises a gate drive device disposed thereon for operably controlling every switching semiconductor device in the integrated power control assembly.

13. The motor assembly of claim 11, wherein the integrated power control assembly further comprises:
one or more capacitors disposed over and across the four input busbars, wherein an individual capacitor is electrically coupled to a battery.

14. The motor assembly of claim 11, wherein a first switching semiconductor device and a first diode in a first set of paired devices are laterally adjacent to a second diode and a second switching semiconductor device in a second set of paired devices respectively, wherein the first set of paired devices and the second set of paired devices are laterally adjacent sets of paired devices.

15. The motor assembly of claim 11, wherein a first switching semiconductor device and a first diode in a first set of paired devices are laterally adjacent to a second switching semiconductor device and a second diode in a second set of paired devices respectively, wherein the first set of paired devices and the second set of paired devices are laterally adjacent sets of paired devices.

16. The motor assembly of claim 11, wherein switching semiconductor devices on adjacent input busbars of opposite polarity are aligned in vertically opposite directions such that gates of the switching semiconductor devices are positioned on opposite surfaces thereof.

17. The motor assembly of claim 11, wherein diodes on adjacent input busbars of opposite polarity are aligned in vertically opposite directions.

18. The motor assembly of claim 11, wherein the substrate comprises:
a thermal interface layer;
a heat-spreading layer disposed over the thermal interface layer, the heat-spreading layer formed from an electrically conductive material; and
an electrical-isolation layer.

19. The motor assembly of claim 11, wherein:
a gate drive device corresponding to a switching semiconductor device disposed on an input busbar of positive polarity is electrically connected to a gate of the switching semiconductor device and grounded to a corresponding output busbar electrically coupled to the switching semiconductor device through electrically conductive vias disposed through the circuit board.

20. The motor assembly of claim 11, wherein:
a gate drive device corresponding to a switching semiconductor device disposed on an input busbar of negative polarity is electrically connected to a gate of the switching semiconductor device through an L-shaped electrically conductive via disposed through the circuit board and an opening within the input busbar of negative polarity; and
the gate drive device is grounded to the input busbar of negative polarity through an electrically conductive via disposed through the circuit board.

* * * * *